US010153170B2

(12) United States Patent
Jang et al.

(10) Patent No.: US 10,153,170 B2
(45) Date of Patent: Dec. 11, 2018

(54) METHOD OF FABRICATING SEMICONDUCTOR DEVICE

(71) Applicant: SAMSUNG ELECTRONICS CO., LTD., Suwon-si, Gyeonggi-do (KR)

(72) Inventors: Hwa Jin Jang, Hwaseong-si (KR); Jae Young Park, Yongin-si (KR); Sun Young Lee, Yongin-si (KR); Ha Kyu Seong, Hwaseong-si (KR); Han Mei Choi, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/416,574

(22) Filed: Jan. 26, 2017

(65) Prior Publication Data

US 2017/0358457 A1    Dec. 14, 2017

(30) Foreign Application Priority Data

Jun. 10, 2016    (KR) ........................ 10-2016-0072151

(51) Int. Cl.
| | | |
|---|---|---|
| *H01L 21/3065* | (2006.01) | |
| *H01L 21/84* | (2006.01) | |
| *H01L 21/263* | (2006.01) | |
| *H01L 29/423* | (2006.01) | |
| *H01L 29/78* | (2006.01) | |
| *H01L 29/66* | (2006.01) | |

(52) U.S. Cl.
CPC ...... *H01L 21/3065* (2013.01); *H01L 21/2633* (2013.01); *H01L 21/845* (2013.01); *H01L 29/42392* (2013.01); *H01L 29/6653* (2013.01); *H01L 29/6681* (2013.01); *H01L 29/66545* (2013.01); *H01L 29/66818* (2013.01); *H01L 29/7853* (2013.01)

(58) Field of Classification Search
None
See application file for complete search history.

(56) References Cited

U.S. PATENT DOCUMENTS

| | | |
|---|---|---|
| 6,885,055 B2 | 4/2005 | Lee |
| 7,229,884 B2 | 6/2007 | Park |
| 7,309,635 B2 | 12/2007 | Park |
| 7,374,986 B2 | 5/2008 | Kim et al. |
| 7,427,788 B2 | 9/2008 | Li et al. |
| 7,494,902 B2 | 2/2009 | Jurczak et al. |
| 7,648,883 B2 | 1/2010 | Park |

(Continued)

FOREIGN PATENT DOCUMENTS

| | | |
|---|---|---|
| KR | 10-0267491 B1 | 12/2000 |
| KR | 10-2001-0026744 A | 4/2001 |
| KR | 10-2005-0112430 A | 11/2005 |

*Primary Examiner* — Angel Roman
(74) *Attorney, Agent, or Firm* — Lee & Morse, P.C.

(57) ABSTRACT

A method of fabricating a semiconductor device is provided. The method includes forming a first fin structure which includes first semiconductor patterns and second semiconductor patterns stacked alternately on a substrate and extends in a first direction, forming an exposed first wire pattern group which includes the second semiconductor patterns by removing the first semiconductor patterns, heat-treating the exposed first wire pattern group, and forming a first gate electrode which surrounds the first wire pattern group and extends in a second direction different from the first direction.

18 Claims, 29 Drawing Sheets

(56) References Cited

U.S. PATENT DOCUMENTS

| | | | |
|---|---|---|---|
| 8,586,454 B2 | 11/2013 | Sleight et al. | |
| 9,129,829 B2 | 9/2015 | Kuhn et al. | |
| 9,184,269 B2 | 11/2015 | Ching et al. | |
| 2006/0216897 A1* | 9/2006 | Lee | B82Y 10/00 |
| | | | 438/282 |
| 2016/0211264 A1* | 7/2016 | Peng | H01L 21/8221 |
| 2016/0293705 A1* | 10/2016 | Lee | H01L 29/1054 |
| 2017/0125526 A1* | 5/2017 | Hatem | H01L 21/02236 |
| 2017/0179301 A1* | 6/2017 | Ching | H01L 29/78618 |
| 2017/0250290 A1* | 8/2017 | Chang | H01L 29/78696 |
| 2017/0317168 A1* | 11/2017 | Cheng | H01L 29/66439 |

\* cited by examiner

METHOD OF FABRICATING SEMICONDUCTOR DEVICE

CROSS-REFERENCE TO RELATED APPLICATION

Korean Patent Application No. 10-2016-0072151, filed on Jun. 10, 2016, in the Korean Intellectual Property Office, and entitled: "Method of Fabricating Semiconductor Device," is incorporated by reference herein in its entirety.

BACKGROUND

1. Field

Embodiments relate to a method of fabricating a semiconductor device.

2. Description of the Related Art

As one of the scaling techniques for increasing the density of a semiconductor device, a multi-gate transistor has been considered.

SUMMARY

Embodiments are directed to a method of fabricating a semiconductor device including forming a first fin structure which includes first semiconductor patterns and second semiconductor patterns stacked alternately on a substrate and extends in a first direction, forming an exposed first wire pattern group which includes of the second semiconductor patterns by removing the first semiconductor patterns, heat-treating the exposed first wire pattern group, and forming a first gate electrode which surrounds the first wire pattern group and extends in a second direction different from the first direction.

Embodiments are also directed to a method of fabricating a semiconductor device including forming a first fin structure which includes first semiconductor patterns and second semiconductor patterns stacked alternately on a substrate and extends in a first direction, forming an exposed first wire pattern group which includes the second semiconductor patterns by partially removing the first semiconductor patterns, vaporizing the first semiconductor patterns remaining on the exposed first wire pattern group, and forming a first gate electrode which surrounds the first wire pattern group and extends in a second direction different from the first direction.

Embodiments are also directed to a method of fabricating a semiconductor device, the method including forming a stack of alternating first and second semiconductor layers on a substrate, the first and second semiconductor layers alternating in a first direction that extends away from the substrate, removing portions of the stack to expose each of first and second semiconductor layers in the stack so as to form alternating first and second semiconductor patterns, subsequently, removing the second semiconductor patterns from between the first semiconductor patterns such that the first semiconductor patterns remain; and subsequently, treating the remaining first semiconductor patterns using a hydrogen plasma.

BRIEF DESCRIPTION OF THE DRAWINGS

Features will become apparent to those of skill in the art by describing in detail example embodiments with reference to the attached drawings in which.

DETAILED DESCRIPTION

Figure 1:
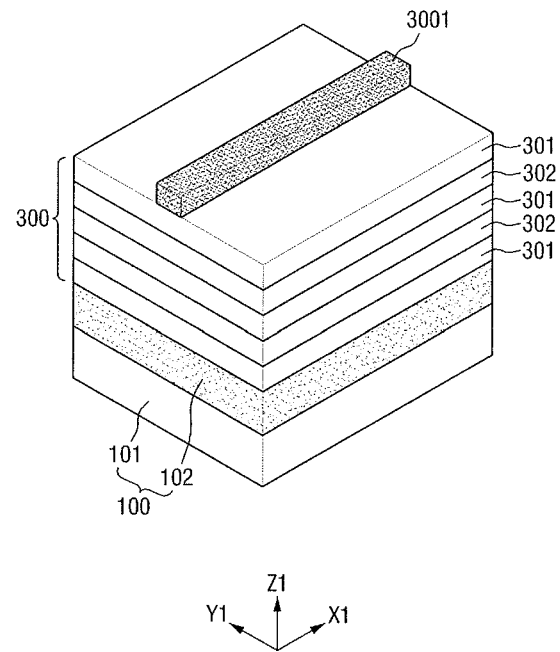
FIGS. 1 through 21 illustrate perspective and cross-sectional views illustrating a method of fabricating a semiconductor device according to some example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Hereinafter, methods of fabricating a semiconductor device according to embodiments will be described with reference to the attached drawings.

A method of fabricating a semiconductor device according to embodiments will now be described with reference to FIGS. 1 through 21.

Figure 8:
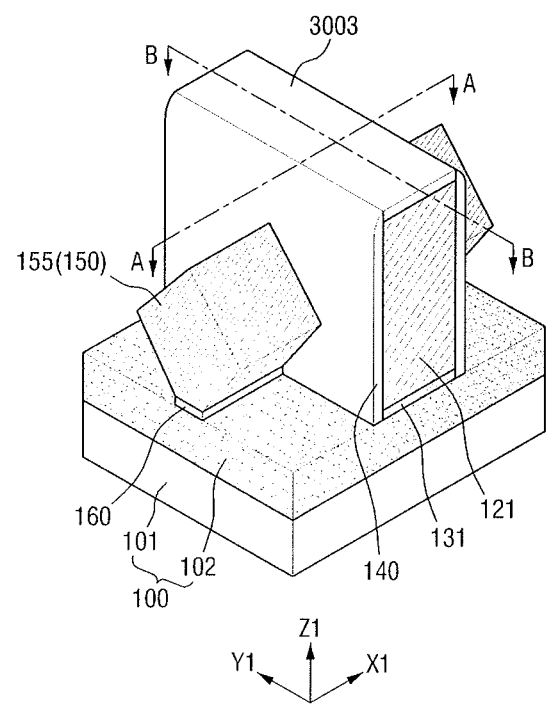
Figure 9:
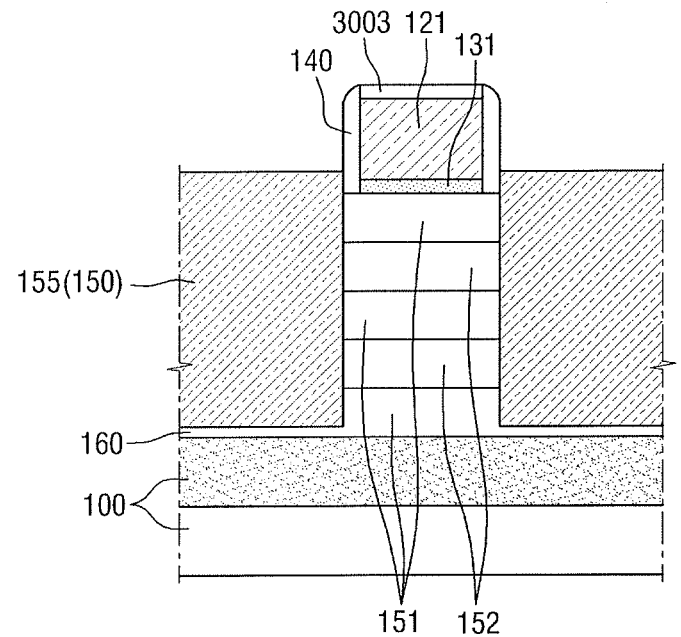
Figure 10:
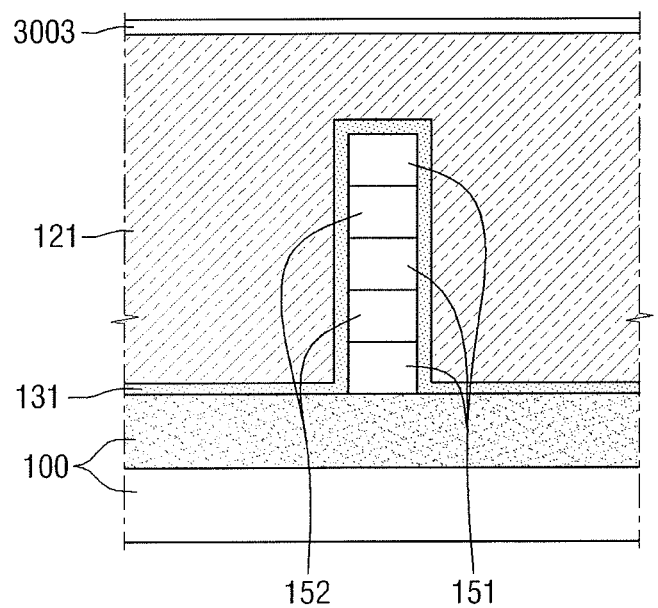

FIGS. 1 through 21 are perspective and cross-sectional views illustrating a method of fabricating a semiconductor device according to some example embodiments. For reference, FIG. 9 is a cross-sectional view taken along the line A-A of FIG. 8, and FIG. 10 is a cross-sectional view taken along the line B-B of FIG. 8.

Referring to FIG. 1, a stacked structure 300, having first semiconductor layers 301 and second semiconductor layers 302 stacked alternately, is formed on a substrate 100.

The substrate 100 may be, for example, a bulk silicon substrate or a silicon-on-insulator (SOI) substrate. In other implementations, the substrate 100 may be a silicon substrate or a substrate made of another material such as silicon germanium, indium antimonide, lead telluride, indium arsenide, indium phosphide, gallium arsenide or gallium antimonide. In other implementations, the substrate 100 may have a base substrate and an epitaxial layer formed on the base substrate.

In a semiconductor device according to the present example embodiment, the substrate 100 is described as including a lower substrate 101 and an upper substrate 102 formed on a surface of the lower substrate 101. For example, the lower substrate 101 may be a semiconductor substrate, and the upper substrate 102 may be an insulating layer substrate. The substrate 100 may include a semiconductor substrate and an insulating layer substrate formed on a surface of the semiconductor substrate and may be, for example, an SOI substrate.

The second semiconductor layers 302 and the first semiconductor layers 301 may be formed alternately on the first semiconductor layer 301 which contacts the substrate 100. The first semiconductor layers 301 and the second semiconductor layers 302 may be formed by, but not limited to, epitaxial growth. A topmost layer of the stacked structure 300 may be, but not limited to, the first semiconductor layer 301.

Of the stacked structure 300, the first semiconductor layer 301 which contacts the substrate 100 may be bonded with the substrate 100 by, but not limited to, wafer bonding.

The first semiconductor layers 301 and the second semiconductor layers 302 may include different materials. The first semiconductor layers 301 and the second semiconductor layers 302 may include materials having different etch selectivities with respect to each other. For example, the first semiconductor layers 301 may include a material having an etch selectivity with respect to the second semiconductor layers 302. Thus, the first semiconductor layers 301 may not be etched well when the second semiconductor layers 302 are etched. Conversely, the second semiconductor layers 302 may not be etched well when the first semiconductor layers 301 are etched.

The first semiconductor layers 301 may include one of, but not limited to, SiGe and Ge.

The second semiconductor layers 302 may include one of, but not limited to, Si and a group III-V compound semiconductor. The group III-V compound semiconductor may be, for example, a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

However, the present disclosure is not limited thereto. The first semiconductor layers 301 may include one of Si and a group III-V compound semiconductor, and the second semiconductor layers 302 may include one of SiGe and Ge.

Next, a first mask pattern 3001 is formed on the stacked structure 300 to extend along a first direction X1.

The first mask pattern 3001 may be made of a material including at least one of a silicon oxide layer, a silicon nitride layer, or a silicon oxynitride layer.

Figure 2:
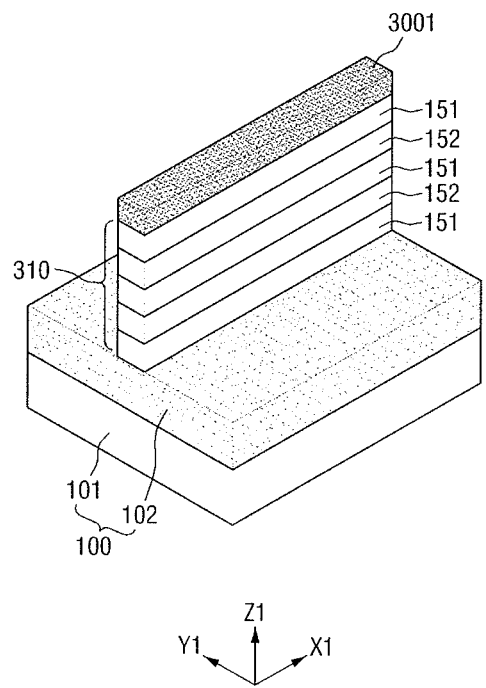
Figure 3:
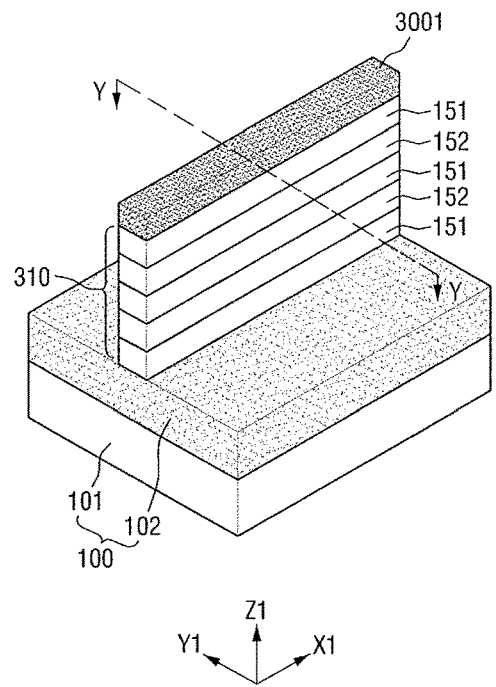

Referring to FIG. 2, the stacked structure 300 is etched using the first mask pattern 3001 as a mask, thereby forming a first fin structure 310. For example, the first fin structure 310 may be formed by etching the stacked structure 300 until an upper surface of the substrate 100 is exposed. The first fin structure 310 may extend along the first direction X1. The first fin structure 310 may include first semiconductor patterns 151 and second semiconductor patterns 152 stacked alternately on the substrate 100.

Next, the first mask pattern 3001 located on the first fin structure 310 may be removed. Then, a first capping layer 131 may be formed on the first fin structure 310.

Figure 4:
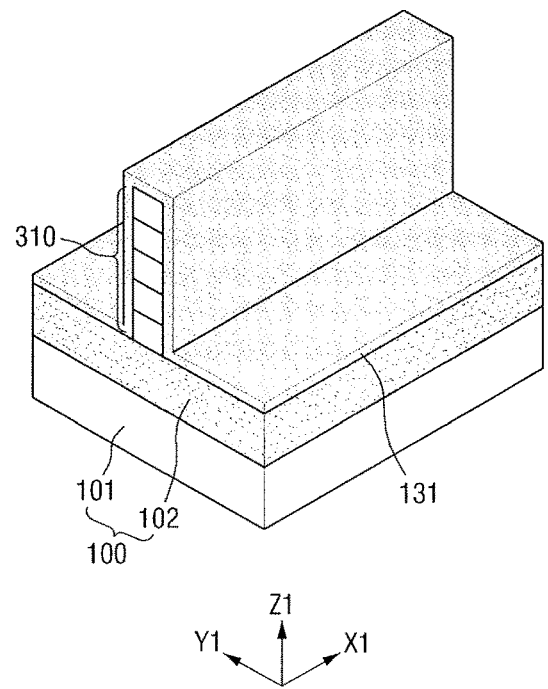

Referring to FIG. 4, the first capping layer 131 may be formed on the substrate 100 to cover the first fin structure 310. The first capping layer 131 may be formed conformally on the substrate 100. The first capping layer 131 may include an insulator such as, but not limited to, a silicon oxide layer.

The first capping layer 131 may be formed by, for example, chemical vapor deposition (CVD), physical vapor deposition (PVD), or atomic layer deposition (ALD).

Figure 5:
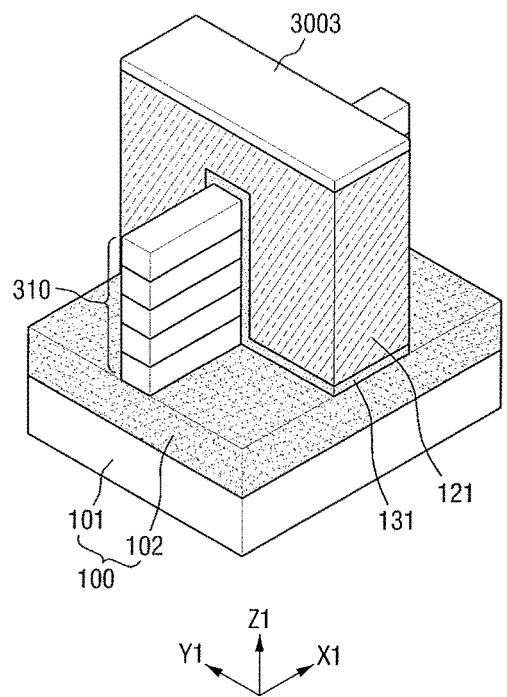

Referring to FIG. 5, an etching process is performed using a third mask pattern 3003, thereby forming the first capping layer 131 and a first dummy gate electrode 121 which extend along a second direction Y1 to intersect the first fin structure 310. Accordingly, the first dummy gate electrode 121 may be formed on the first fin structure 310.

Figure 6:
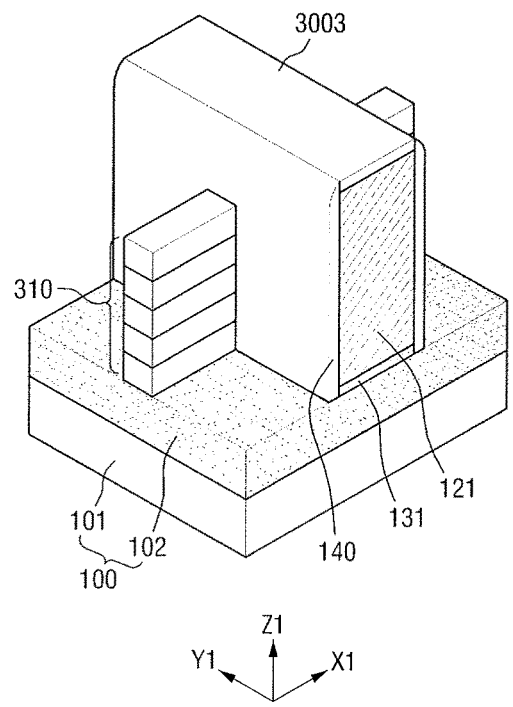

Referring to FIG. 6, first gate spacers 140 are formed on sidewalls of the first dummy gate electrode 121.

For example, a spacer layer is formed on the substrate 100 to cover the first dummy gate electrode 121 and the first fin structure 310. Then, the spacer layer is etched back, thereby forming the first gate spacers 140 on the sidewalls of the first dummy gate electrode 121.

The first gate spacers 140 may include at least one of, for example, silicon nitride (SiN), silicon oxynitride (SiON), silicon oxide (SiO$_2$), silicon oxycarbonitride (SiOCN), and a combination thereof. Each of the first gate spacers 140 is illustrated as a single layer in the drawing. However, the present disclosure is not limited thereto, and each of the first gate spacers 140 may also have a multilayer structure.

Figure 7:
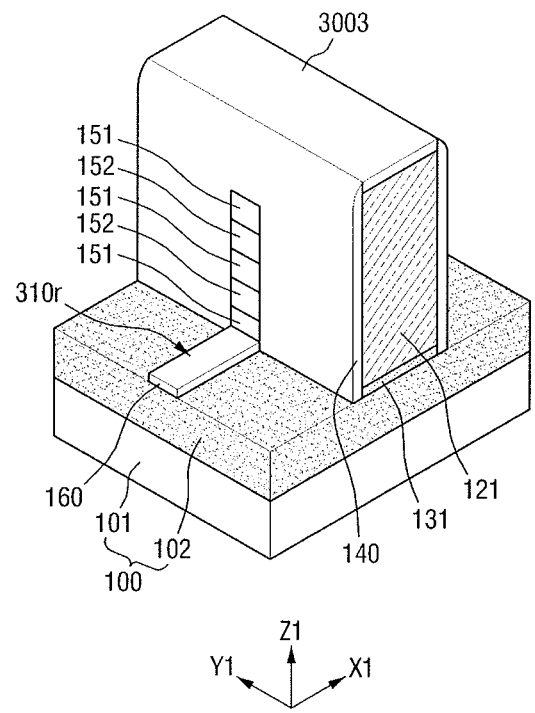

Referring to FIG. 7, the first fin structure 310 exposed on both sides of the first dummy gate electrode 121 and the first gate spacers 140 is removed to form first recesses 310r in the first fin structure 310.

During the formation of the first recesses 310r, the first semiconductor pattern 151 which contacts the substrate 100 may be partially left, thereby forming a first epitaxial seed layer 160. However, the present disclosure is not limited thereto. Thus, the first semiconductor pattern 151 which contacts the substrate 100 may also be completely removed, thereby exposing the upper surface of the substrate 100.

The first and second semiconductor patterns 151 and 152 stacked alternately on the substrate 100 are exposed through side surfaces of the first recesses 310r.

Referring to FIGS. 8 through 10, a first epitaxial layer 155 is formed on the first fin structure 310 to fill the first recesses 310r. Thus, first source/drain regions 150 are formed on both sides of the first dummy gate electrode 121.

The first epitaxial layer 155 may be formed by epitaxial growth. The epitaxial layer 155 may be grown using the first epitaxial seed layer 160 and the first and second semiconductor patterns 151 and 152 exposed through the side surfaces of the first recesses 310r as a seed layer. Without the first epitaxial seed layer 160, the first epitaxial layer 155 may be grown using the first and second semiconductor patterns 151 and 152 exposed through the side surfaces of the first recesses 310r as a seed layer.

An outer circumferential surface of the first epitaxial layer 155 may have various shapes. For example, the outer circumferential surface of the first epitaxial layer 155 may have at least one of a diamond shape, a circular shape, and a rectangular shape. In FIG. 8, the outer circumferential surface of the first epitaxial layer 155 has a diamond shape (or a pentagonal shape or a hexagonal shape).

The first epitaxial layer 155 may include a material that can apply compressive stress to the second semiconductor patterns 152 which may be used as a channel region of a p-channel metal oxide semiconductor (PMOS) through a subsequent process. The first epitaxial layer 155 may include a material having a greater lattice constant than the second semiconductor patterns 152.

The first epitaxial layer 155 may include a material that can apply tensile stress to the second semiconductor patterns 152 which may be used as a channel region of an n-channel metal oxide semiconductor (NMOS) through a subsequent process or may include the same material as the second semiconductor patterns 152. The first epitaxial layer 155 may include a material having a smaller lattice constant than the second semiconductor patterns 152 or may include the same material as the second semiconductor patterns 152. When the second semiconductor patterns 152 are Si, the first epitaxial layer 155 may be Si or a material (for example, SiC) having a smaller lattice constant than Si.

On the other hand, when the second semiconductor patterns 152 are used as a channel region of a PMOS, the first epitaxial layer 155 may include a material that can apply compressive stress to the second semiconductor patterns 152. When the second semiconductor patterns 152 are SiGe, the first epitaxial layer 155 may be SiGe having higher Ge content than the second semiconductor patterns 152.

In FIGS. 9 and 10, the first epitaxial layer 155 contacts the first and second semiconductor patterns 151 and 152 located under the first dummy gate electrode 121 and the first gate spacers 140.

The following description is based on FIGS. 9 and 10.

Figure 11:
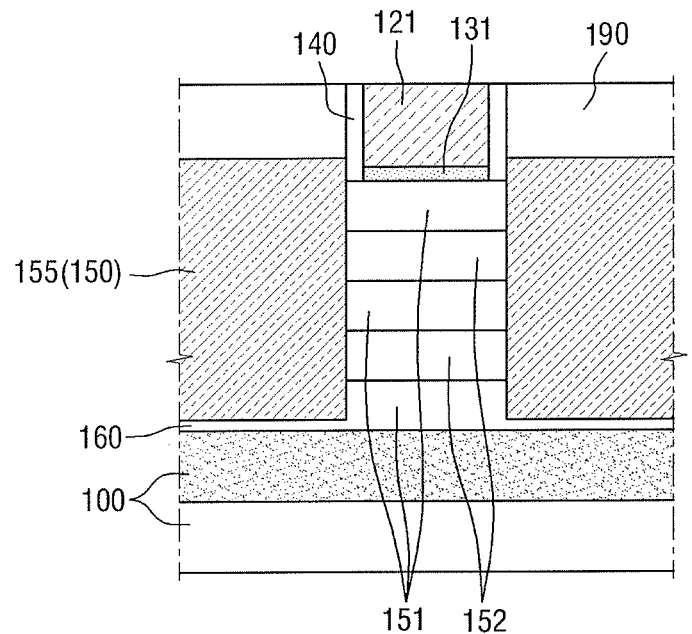
Figure 12:
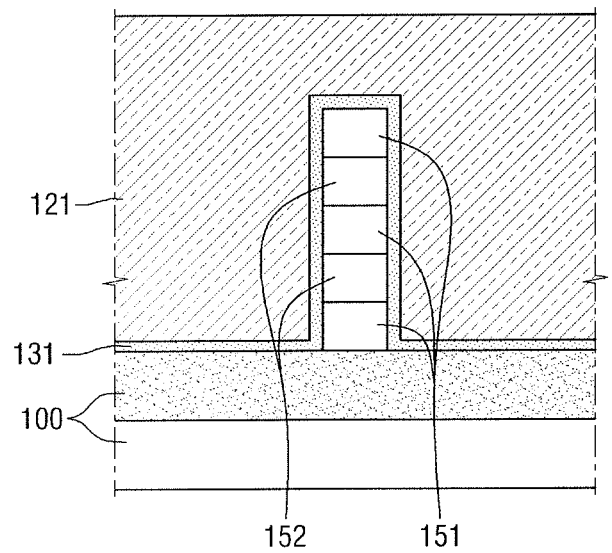

Referring to FIGS. 11 and 12, an interlayer insulating film 190 is formed on the substrate 100 to cover the first source/drain regions 150, the first dummy gate electrode 121, the first gate spacers 140, etc. Then, the interlayer insulating film 190 is planarized until the first dummy gate electrode 121 is exposed. As a result, the third mask pattern 3003 may be removed, and an upper surface of the first dummy gate electrode 121 may be exposed.

The interlayer insulating film 190 may include at least one of, for example, a low-k material, an oxide layer, a nitride layer, or an oxynitride layer. The low-k material may be made of Flowable Oxide (FOX), Tonen SilaZen (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or a combination thereof.

Figure 13:
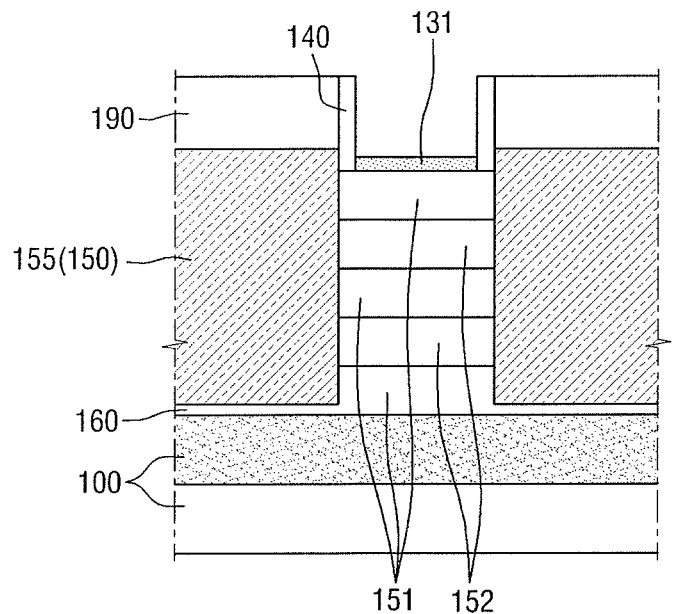
Figure 14:
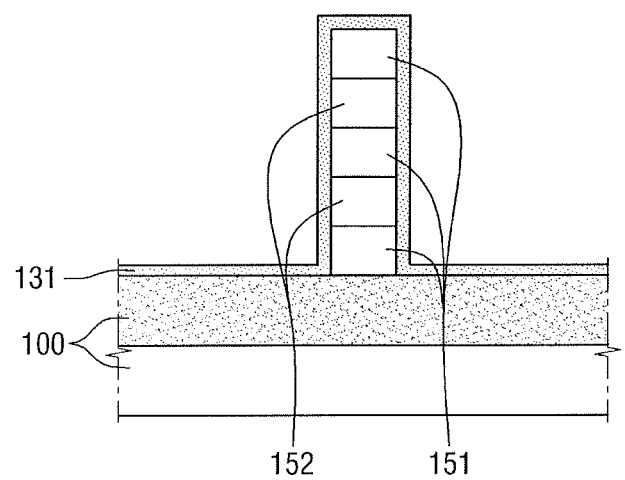

Referring to FIGS. 13 and 14, the first dummy gate electrode 121 having the exposed upper surface is removed. The removal of the first dummy gate electrode 121 may expose the first capping layer 131.

Figure 15:
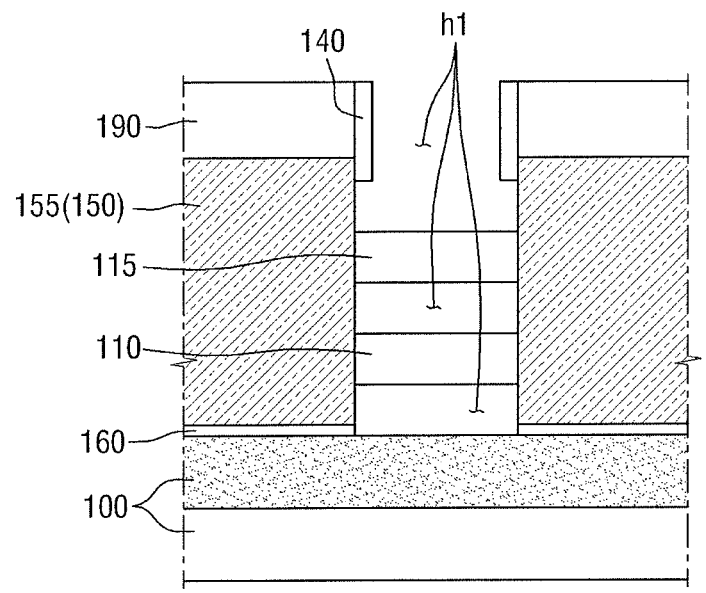
Figure 16:
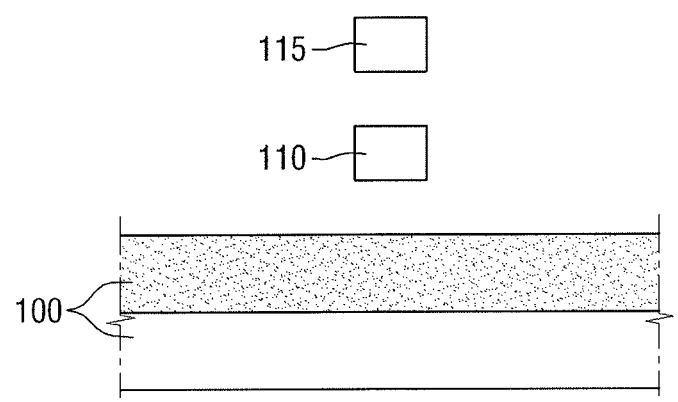

Referring to FIGS. 15 and 16, an etching process is performed to sequentially remove the first capping layer 131 and the first semiconductor patterns 151.

Accordingly, a first wire pattern 110 and a second wire pattern 115 made of the second semiconductor patterns 152 are formed. Thus, a first wire pattern group (110 and 115) including one or more wire patterns is formed. The first wire pattern group (110 and 115) extends along the first direction X1. The first wire pattern 110 is formed on the upper substrate 102 to be separated from the upper substrate 102. Thus, the first wire pattern 110 does not contact the substrate 100.

In the current embodiments, each of the first wire pattern 110 and the second wire pattern 115 has a quadrilateral cross-section. However, the present disclosure is not limited thereto, and corners of each of the first wire pattern 110 and the second wire pattern 115 may be rounded by a trimming process.

The removal of the first semiconductor patterns 151 may create spaces h1. In addition, the first epitaxial layer 155 may be exposed through the spaces h1.

Figure 17:
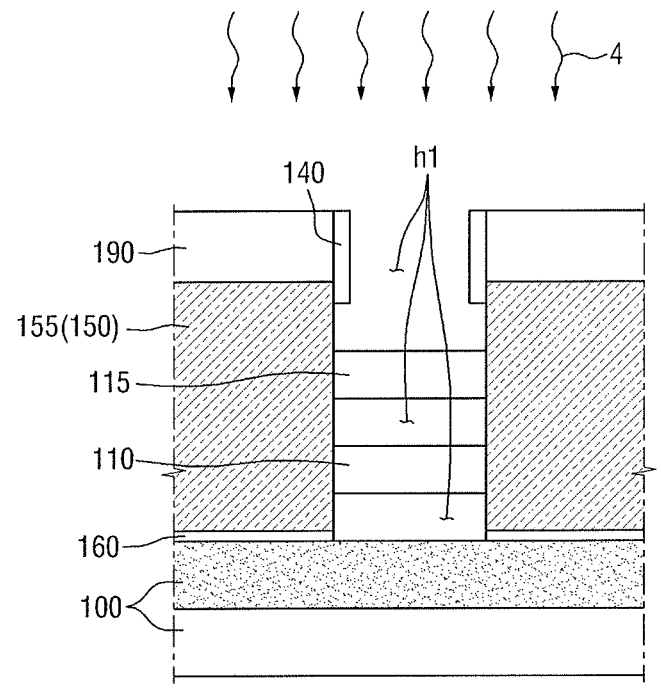
Figure 18:
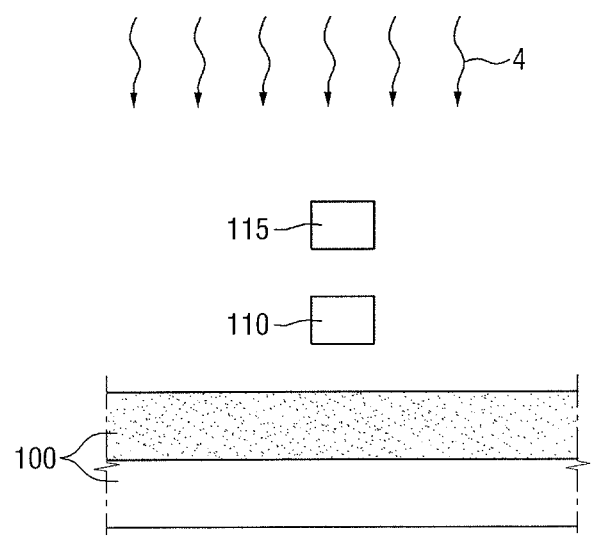

Referring to FIGS. 17 and 18, surfaces of the first wire pattern 110 and the second wire pattern 115 are heat-treated as indicated by reference numeral 4. Thus, a surface of the first wire pattern group (110 and 115) is heat-treated as indicated by reference numeral 4.

The heat-treatment process 4 may be, for example, hydrogen annealing or hydrogen plasma annealing (HPA). Thus, the heat-treatment process 4 according to the current embodiments may be a heat-treatment process using hydrogen plasma within a chamber, for example by providing hydrogen gas or a reactive hydrogen species to a plasma chamber. The heat-treatment process 4 may be performed at a temperature of 650° C. or below.

The heat-treatment process 4 may improve the surface roughness of each of the first wire pattern 110 and the second wire pattern 115.

For example, even if the first semiconductor patterns 151 are removed by the etching process of FIGS. 15 and 16, part of the first semiconductor patterns 151 may remain on the surfaces of the first wire pattern 110 and the second wire pattern 115. For example, when the first semiconductor patterns 151 are SiGe and when the second semiconductor patterns 152 are Si, part of SiGe may remain on the surfaces of the first wire pattern 110 and the second wire pattern 115 which include Si.

The SiGe remaining on the surfaces of the first wire pattern 110 and the second wire pattern 115 may later become trap charges, thereby increasing interface trap density. The increased interface trap density may change a threshold voltage of a completed semiconductor device and decrease the mobility of electrons or holes in a channel.

Therefore, the method of fabricating a semiconductor device according to the present example embodiment includes the process 4 of heat-treating the exposed surfaces of the first wire pattern 110 and the second wire pattern 115. In the heat-treatment process 4, a Ge—Ge bond having a smaller bonding energy than a Si—Si bond may be broken to produce Ge atoms, and the Ge atoms may form a Ge—H bond with hydrogen plasma. Therefore, Ge located on the exposed surfaces of the first wire pattern 110 and the second wire pattern 115 may evaporate as a Ge—$H_4$ gas.

Thus, the method of fabricating a semiconductor device according to the present example embodiment may reduce a Ge-rich phenomenon of the exposed surfaces of the first wire pattern 110 and the second wire pattern 115.

In the heat-treatment process 4, a Si—Ge bond may also chemically react with hydrogen plasma, thereby forming thermodynamically stable Si—Si. In addition, Ge atoms may vaporize as a Ge—$H_4$ gas.

Thus, the heat-treatment process 4 included in the method of fabricating a semiconductor device according to the present example embodiment helps to reduce Ge concentration on the exposed surfaces of the first wire pattern 110 and the second wire pattern 115, thereby helping to form the first wire pattern 110 and the second wire pattern 115 as relatively pure Si channels. In addition, since hydrogen plasma and Si atoms also react with each other, the Si atoms may physically move to be rearranged and recombined on the surfaces of the first wire pattern 110 and the second wire pattern 115. This may improve the surface roughness of each of the first wire pattern 110 and the second wire pattern 115.

Figure 19:
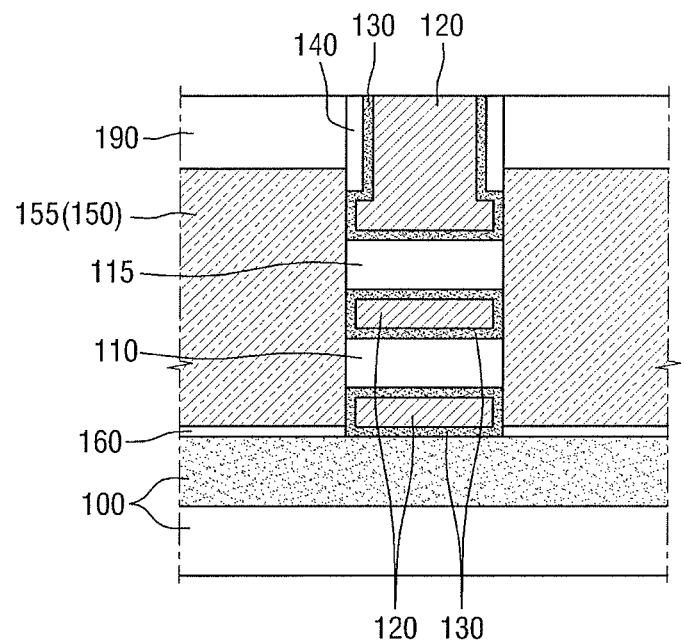
Figure 20:
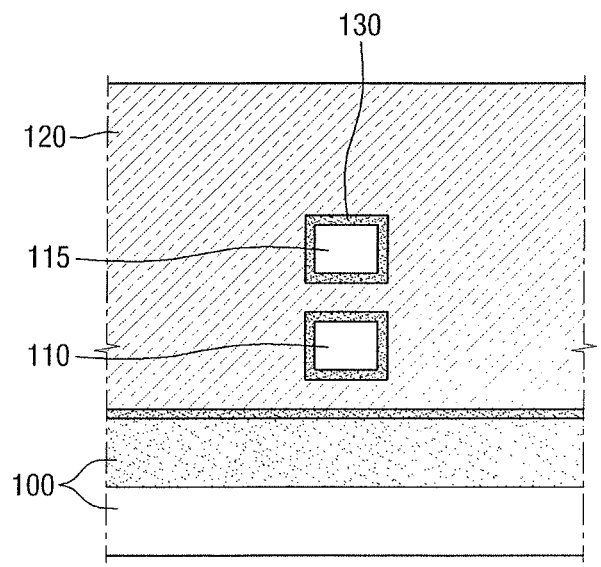
Figure 21:
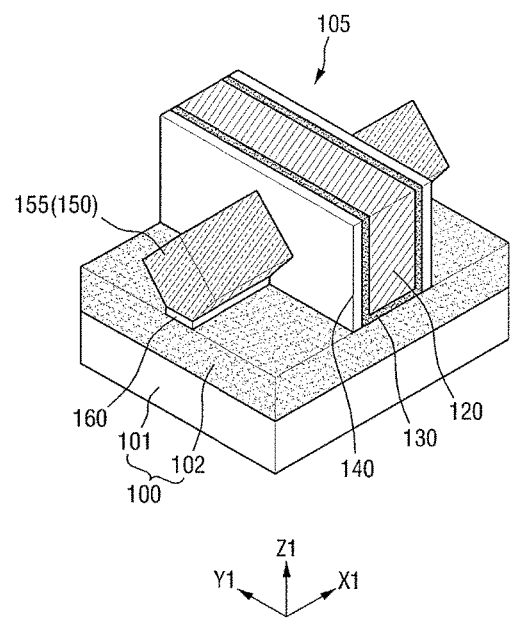

Referring to FIGS. 19 and 20, a first gate insulating layer 130 is formed around the first wire pattern 110 and the second wire pattern 115 and along sidewalls of the first gate spacers 140 and the exposed first epitaxial layer 155. The first gate insulating layer 130 may be formed conformally. Accordingly, portions of the first epitaxial layer 155 which are exposed by the removal of the first semiconductor patterns 151 contact the first gate insulating layer 130.

The first gate insulating layer 130 may include a high-k material having a higher dielectric constant than a silicon oxide layer. For example, the first gate insulating layer 130 may include one or more of, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Next, a first gate electrode 120 is formed on the first gate insulating layer 130 to surround the first wire pattern 110 and the second wire pattern 115. The first gate electrode 120 extends along the second direction Y1. The first gate electrode 120 may also be formed in a space between the first wire pattern 110 and the substrate 100.

The first gate electrode 120 may include a conductive material. In the drawings, the first gate electrode 120 is a single layer. However, this is merely an example used for ease of description, and the present disclosure is not limited to this example. Thus, the first gate electrode 120 may include a work function conductive layer which controls a work function and a filling conductive layer which fills a space formed by the work function conductive layer which controls the work function.

The first gate electrode 120 may include at least one of, for example, TiN, WN, TaN, Ru, TiC, TaC, Ti, Ag, Al, TiAl, TiAlN, TiAlC, TaCN, TaSiN, Mn, Zr, W, and Al. In other implementations, the first gate electrode 120 may be made of a material (for example, Si or SiGe) other than a metal. The first gate electrode 120 may be foiled by, but not limited to, a replacement process.

To form the first gate insulating layer 130 and the first gate electrode 120, a planarization process may be performed. The processes of FIGS. 1 through 20 described above may produce a semiconductor device illustrated in FIG. 21.

A method of fabricating a semiconductor device according to some example embodiments will now be described with reference to FIGS. 22 through 45. The method of fabricating a semiconductor device according to the current embodiments is substantially the same as the method of fabricating a semiconductor device according to the previous embodiments of FIGS. 1 through 22 except that a plurality of semiconductor elements using different semiconductor materials as channel regions are formed in different areas. Therefore, the current embodiments will hereinafter be described, focusing mainly on differences with the previous embodiments.

Figure 30:
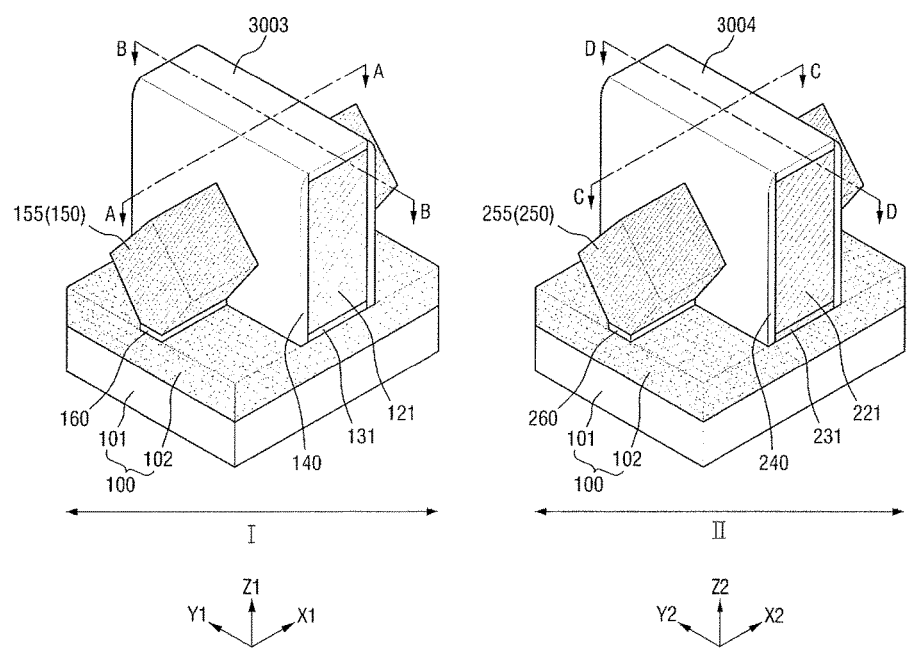
Figure 31:
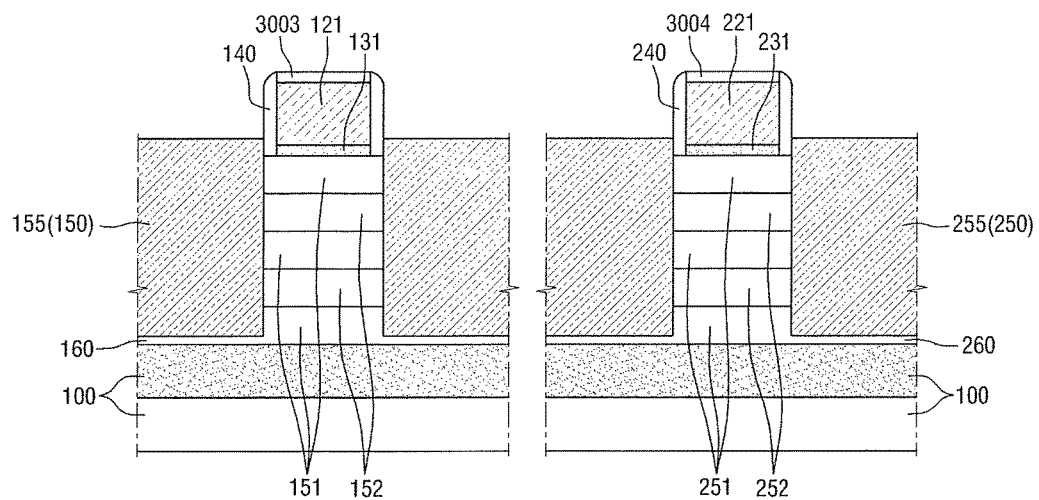
Figure 32:
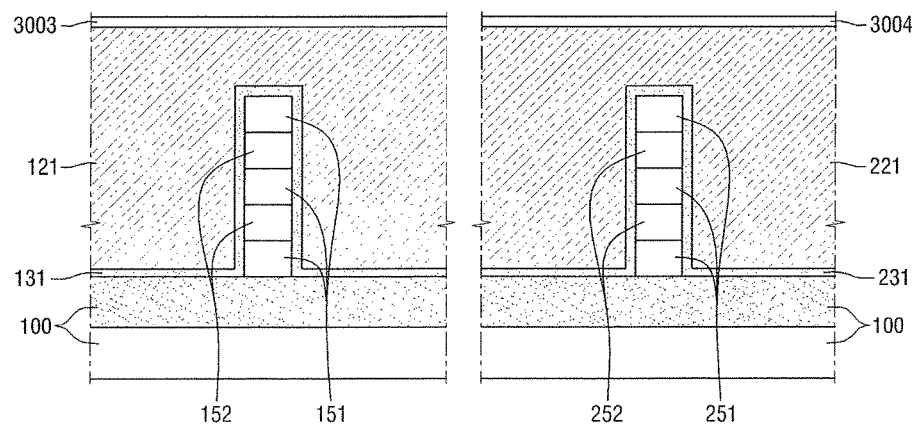

FIGS. 22 through 45 are perspective and cross-sectional views illustrating a method of fabricating a semiconductor device according to some example embodiments. For reference, FIG. 31 shows cross-sectional views taken along the lines A-A and C-C of FIG. 30, and FIG. 32 shows cross-sectional views taken along the lines B-B and D-D of FIG. 30.

Figure 22:
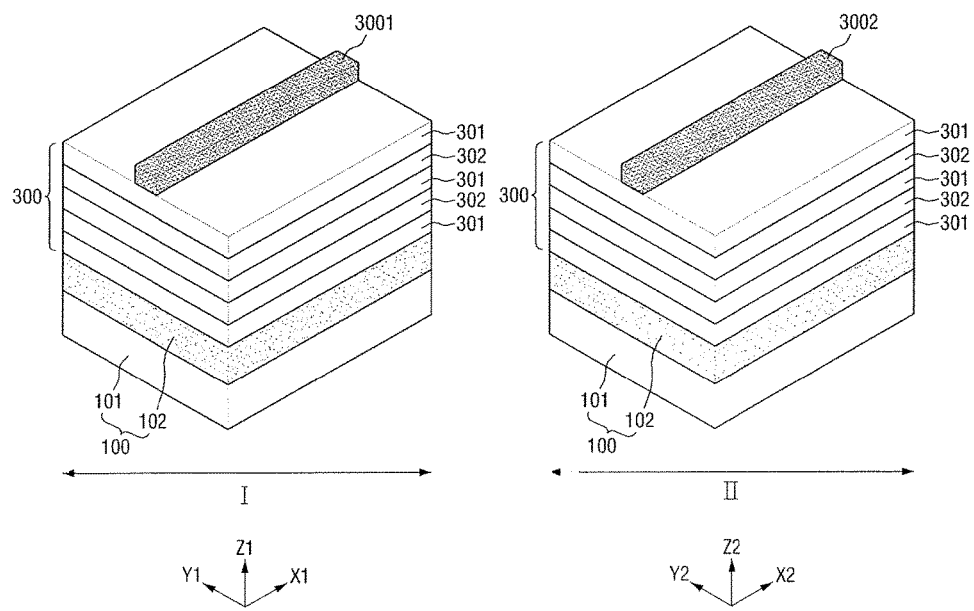
FIGS. 22 through 45 illustrate perspective and cross-sectional views illustrating a method of fabricating a semiconductor device according to some example embodiments.

Referring to FIG. 22, a stacked structure 300 having first semiconductor layers 301 and second semiconductor layers 302 stacked alternately is formed on a substrate 100.

The substrate 100 may include a first area I and a second area II. The first area I and the second area II may be separated from each other or may be connected to each other. For example, the first area I may include, but not limited to, a P-type transistor area, and the second area II may include, but not limited to, an N-type transistor area.

The second semiconductor layers 302 and the first semiconductor layers 301 may be formed alternately on the first semiconductor layer 301 which contacts the substrate 100. The first semiconductor layers 301 and the second semiconductor layers 302 may be formed by, but not limited to, epitaxial growth. A topmost layer of the stacked structure 300 may be, but not limited to, the first semiconductor layer 301.

The first semiconductor layers 301 and the second semiconductor layers 302 may include different materials. The first semiconductor layers 301 and the second semiconductor layers 302 may include materials having different etch selectivities with respect to each other. For example, the first semiconductor layers 301 may include a material having an etch selectivity with respect to the second semiconductor layers 302. Thus, the first semiconductor layers 301 may not be etched well when the second semiconductor layers 302 are etched. Conversely, the second semiconductor layers 302 may not be etched well when the first semiconductor layers 301 are etched. The reason why the second semiconductor layers 302 include a material having an etch selectivity with respect to the first semiconductor layers 301 will be described again in a subsequent process.

The first semiconductor layers 301 may include one of, but not limited to, Si and a group III-V compound semiconductor. The group III-V compound semiconductor may be, for example, a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

The second semiconductor layers 302 may include one of, but not limited to, SiGe and Ge.

In the first area I, a first mask pattern 3001 is formed on the stacked structure 300 to extend along a first direction X1. In the second area II, a second mask pattern 3002 is formed on the stacked structure 300 to extend along a third direction X2.

Each of the first mask pattern 3001 and the second mask pattern 3002 may be made of a material including at least one of, for example, a silicon oxide layer, a silicon nitride layer, and a silicon oxynitride layer.

Figure 23:
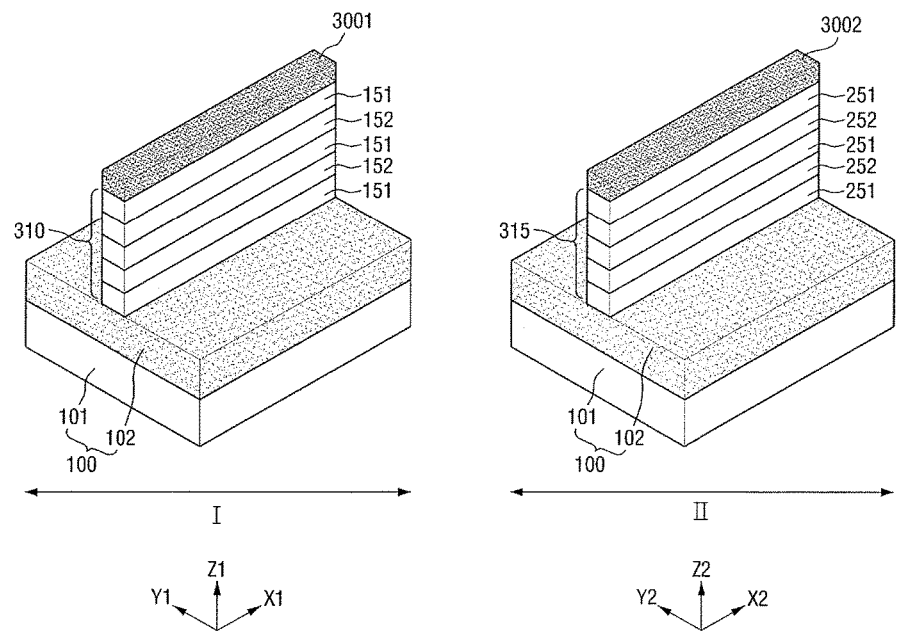

Referring to FIG. 23, the stacked structure 300 is etched using the first mask pattern 3001 and the second mask pattern 3002 as a mask, thereby forming a first fin structure 310 and a second fin structure 315. For example, the first fin structure 310 and the second fin structure 315 may be formed by etching the stacked structure 300 until an upper surface of the substrate 100 is exposed.

The first fin structure 310 may be formed in the first area I, and the second fin structure 315 may be formed in the second area II. The first fin structure 310 may extend along the first direction X1, and the second fin structure 315 may extend along the third direction X2.

The first fin structure 310 may include first semiconductor patterns 151 and second semiconductor patterns 152 stacked alternately on the substrate 100. The second fin structure 315 may include third semiconductor patterns 251 and fourth semiconductor patterns 252 stacked alternately on the substrate 100.

The first semiconductor patterns 151 and the third semiconductor patterns 251 may be formed by etching the first semiconductor layers 301. Thus, the first semiconductor patterns 151 and the third semiconductor patterns 251 may include the same material. In addition, the second semiconductor patterns 152 and the fourth semiconductor patterns 252 may be formed by etching the second semiconductor layers 302. Thus, the second semiconductor patterns 152 and the fourth semiconductor patterns 252 may include the same material.

Next, the first mask pattern 3001 and the second mask pattern 3002 located on the first fin structure 310 and the second fin structure 315 may be removed.

Figure 24:
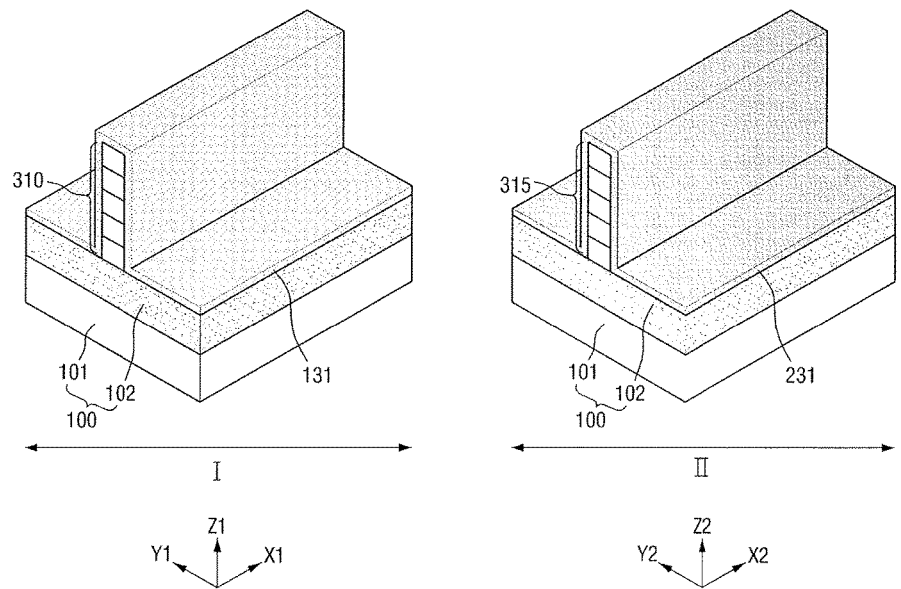

Referring to FIG. 24, a first capping layer 131 may be formed on the first fin structure 310. In addition, a second capping layer 231 may be formed on the second fin structure 315.

The first capping layer 131 and the second capping layer 231 may be formed conformally on the substrate 100. Each of the first capping layer 131 and the second capping layer 231 may include an insulator such as, but not limited to, a silicon oxide layer.

The first capping layer 131 and the second capping layer 231 may be formed by, for example, Chemical Vapor Deposition (CVD), Physical Vapor Deposition (PVD), or Atomic Layer Deposition (ALD).

The first capping layer 131 and the second capping layer 231 may include different materials. For example, the second capping layer 231 may include a semiconductor material, for example, one of, but not limited to, SiGe and Ge. The second capping layer 231 may include the same semiconductor material as the fourth semiconductor patterns 252, but the present disclosure is not limited thereto.

Figure 25:
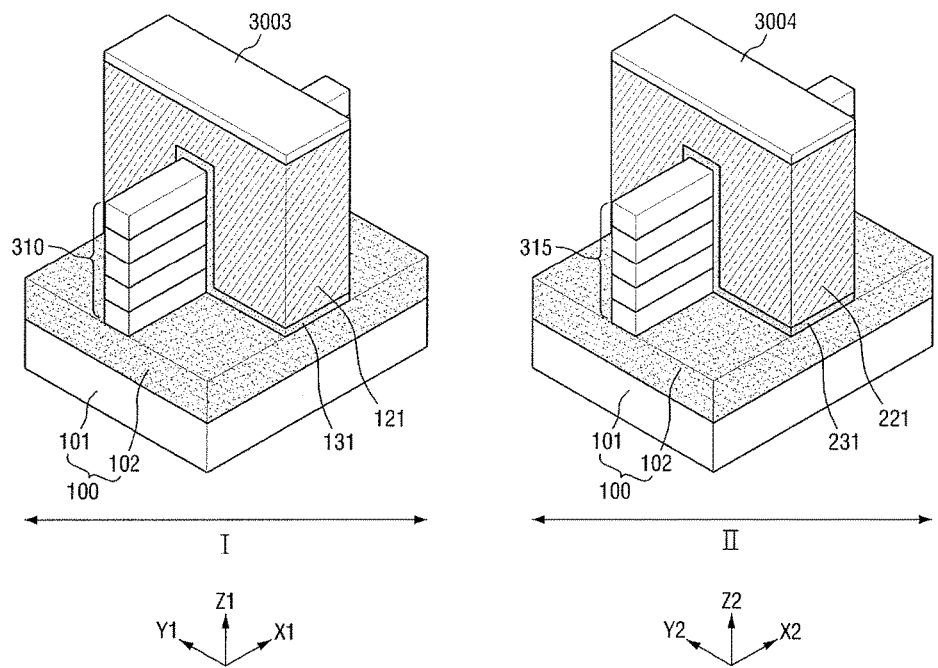

Referring to FIG. 25, an etching process is performed using a third mask pattern 3003, thereby forming the first capping layer 131 and a first dummy gate electrode 121 which extend along a second direction Y1 to intersect the first fin structure 310.

In addition, an etching process is performed using a fourth mask pattern 3004, thereby forming the second capping layer 231 and a second dummy gate electrode 221 which extend along a fourth direction Y2 to intersect the second fin structure 315.

Accordingly, the first dummy gate electrode 121 may be formed on the first fin structure 310, and the second dummy gate electrode 221 may be formed on the second fin structure 315. Each of the first dummy gate electrode 121 and the second dummy gate electrode 221 may be one of, but not limited to, polysilicon and amorphous silicon.

Figure 26:
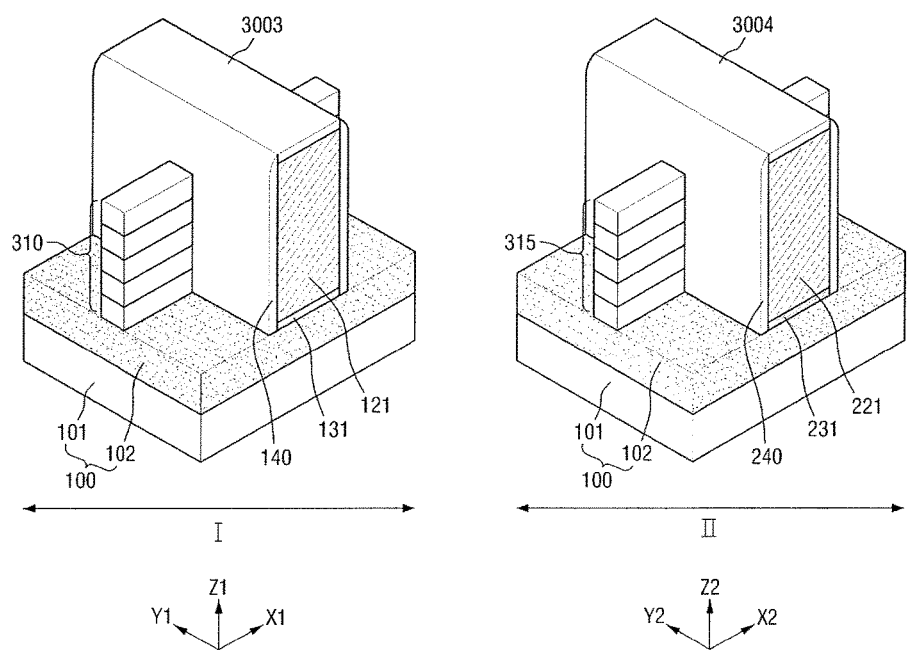

Referring to FIG. 26, first gate spacers 140 are formed on sidewalls of the first dummy gate electrode 121. In addition, second gate spacers 240 are formed on sidewalls of the second dummy gate electrode 221.

For example, a spacer layer is formed on the substrate 100 to cover the first dummy gate electrode 121, the second dummy gate electrode 221, the first fin structure 310, and the second fin structure 315. Then, the spacer layer is etched back, thereby forming the first gate spacers 140 on the sidewalls of the first dummy gate electrode 121 and the second gate spacers 240 on the sidewalls of the second dummy gate electrode 221.

Each of the first and second gate spacers 140 and 240 may include at least one of, for example, silicon nitride (SiN), silicon oxynitride (SiON), silicon oxide (SiO₂), silicon oxycarbonitride (SiOCN), and a combination thereof. Each of the first and second gate spacers 140 and 240 is illustrated as a single layer in the drawing. However, the present disclosure is not limited thereto, and each of the first and second gate spacers 140 and 240 may also have a multilayer structure.

Figure 27:
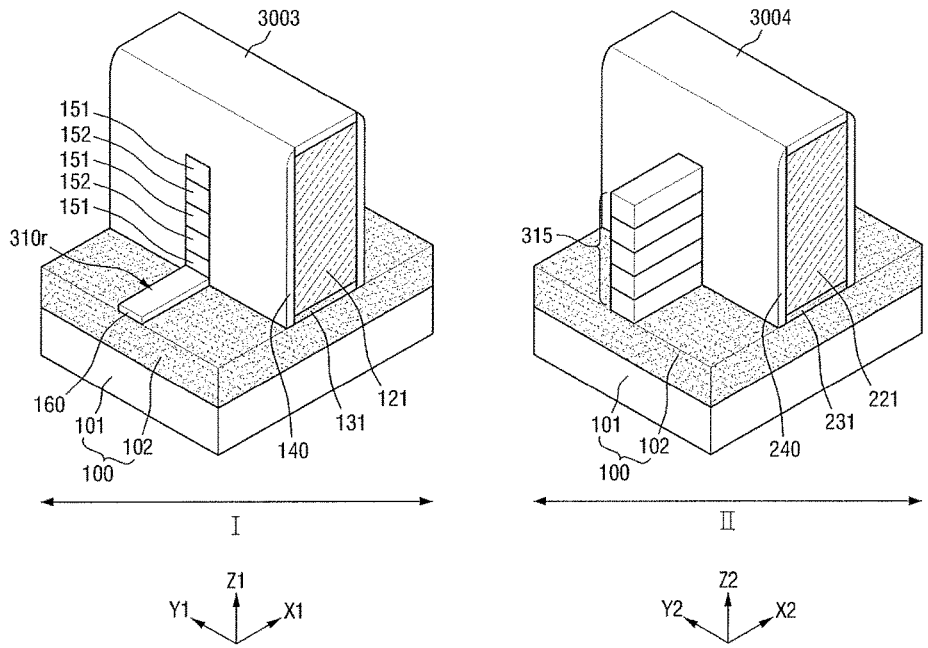

Referring to FIG. 27, the first fin structure 310 exposed on both sides of the first dummy gate electrode 121 and the first gate spacers 140 is removed to form first recesses 310r in the first fin structure 310.

During the formation of the first recesses 310r, the first semiconductor pattern 151 which contacts the substrate 100 may be partially left, thereby forming a first epitaxial seed layer 160. However, the present disclosure is not limited thereto. Thus, the first semiconductor pattern 151 which contacts the substrate 100 may also be completely removed, thereby exposing the upper surface of the substrate 100.

The first and second semiconductor patterns 151 and 152 stacked alternately on the substrate 100 are exposed through side surfaces of the first recesses 310r.

When the first recesses 310r are formed in the first fin structure 310, the second area II may be covered with a photosensitive layer pattern, but the present disclosure is not limited thereto.

Figure 28:
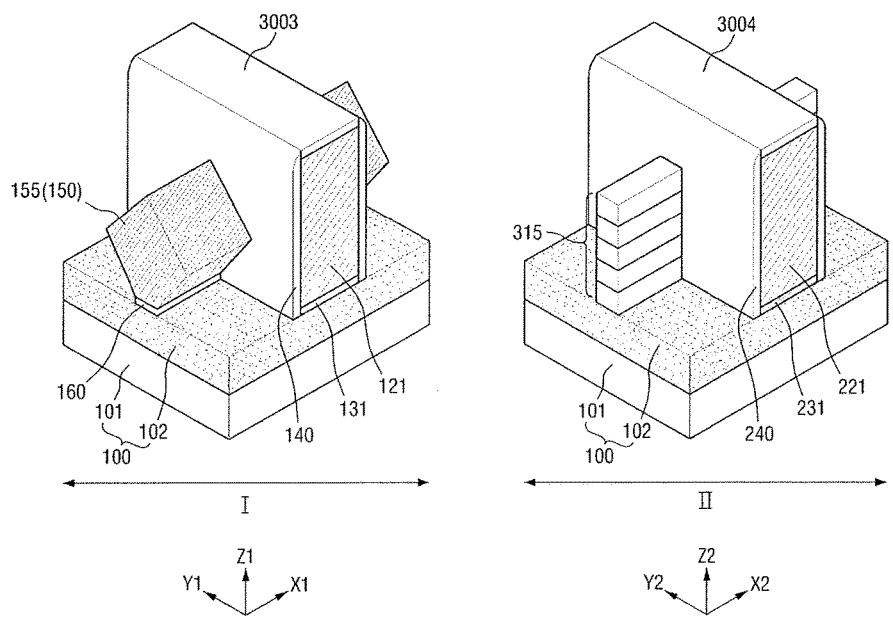

Referring to FIG. 28, a first epitaxial layer 155 is formed on the first fin structure 310 to fill the first recesses 310r.

Thus, first source/drain regions 150 are formed on both sides of the first dummy gate electrode 121.

The first epitaxial layer 155 may be formed by epitaxial growth. The epitaxial layer 155 may be grown using the first epitaxial seed layer 160 and the first and second semiconductor patterns 151 and 152 exposed through the side surfaces of the first recesses 310r as a seed layer. Without the first epitaxial seed layer 160, the first epitaxial layer 155 may be grown using the first and second semiconductor patterns 151 and 152 exposed through the side surfaces of the first recesses 310r as a seed layer.

An outer circumferential surface of the first epitaxial layer 155 may have various shapes. For example, the outer circumferential surface of the first epitaxial layer 155 may have at least one of a diamond shape, a circular shape, and a rectangular shape. In FIG. 28, the outer circumferential surface of the first epitaxial layer 155 has a diamond shape (or a pentagonal shape or a hexagonal shape).

The first epitaxial layer 155 may include a material that can apply compressive stress to the second semiconductor patterns 152 which may be used as a channel region of a PMOS through a subsequent process. The first epitaxial layer 155 may include a material having a greater lattice constant than the second semiconductor patterns 152. When the second semiconductor patterns 152 include SiGe, the first epitaxial layer 155 may include SiGe having higher Ge content than the second semiconductor patterns 152.

Figure 29:
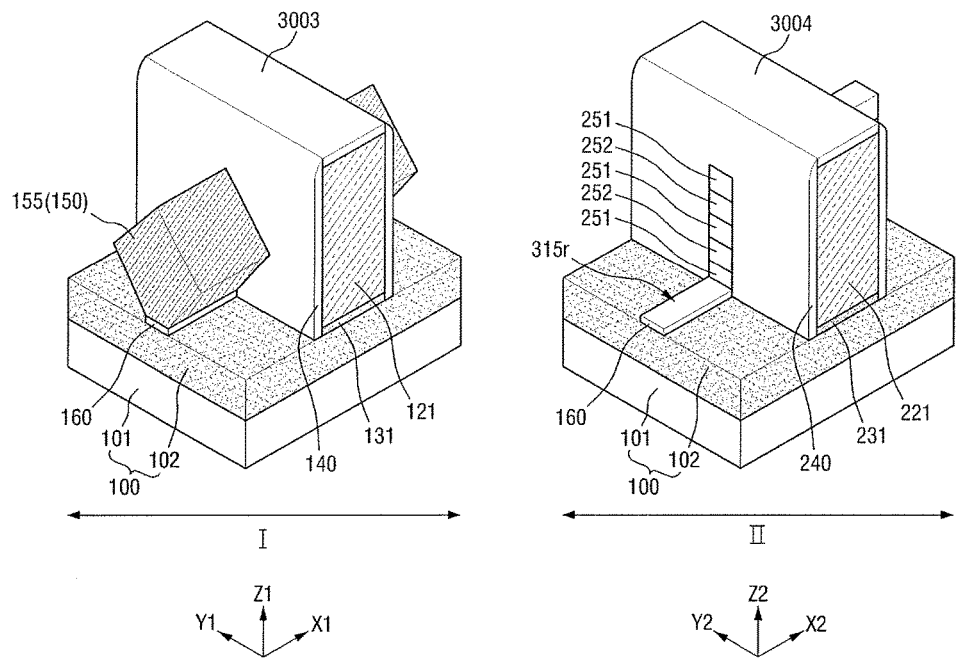

Referring to FIG. 29, the second fin structure 315 exposed on both sides of the second dummy gate electrode 221 and the second gate spacers 240 is removed to form second recesses 315r in the second fin structure 315.

During the formation of the second recesses 315r, the third semiconductor pattern 251 which contacts the substrate 100 may be partially left, thereby forming a second epitaxial seed layer 260. However, the present disclosure is not limited thereto. Thus, the third semiconductor pattern 251 which contacts the substrate 100 may also be completely removed, thereby exposing the upper surface of the substrate 100.

The third and fourth semiconductor patterns 251 and 252 stacked alternately on the substrate 100 are exposed through side surfaces of the second recesses 315r.

When the second recesses 315r are formed in the second fin structure 315, the first area I may be covered with a photosensitive layer pattern, but the present disclosure is not limited thereto.

Referring to FIGS. 30 through 32, a second epitaxial layer 255 is formed on the second fin structure 315 to fill the second recesses 315r. Thus, second source/drain regions 250 are formed on both sides of the second dummy gate electrode 221.

The second epitaxial layer 255 may be grown using the second epitaxial seed layer 260 and the third and fourth semiconductor patterns 251 and 252 exposed through the side surfaces of the second recesses 315r as a seed layer. Without the second epitaxial seed layer 260, the second epitaxial layer 255 may be grown using the third and fourth semiconductor patterns 251 and 252 exposed through the side surfaces of the second recesses 315r as a seed layer.

An outer circumferential surface of the second epitaxial layer 255 may have various shapes. For example, the outer circumferential surface of the second epitaxial layer 255 may have at least one of a diamond shape, a circular shape, and a rectangular shape. In FIG. 30, the outer circumferential surface of the second epitaxial layer 255 has a diamond shape (or a pentagonal shape or a hexagonal shape).

The second epitaxial layer 255 may include a material that can apply tensile stress to the third semiconductor patterns 251 which may be used as a channel region of an NMOS through a subsequent process or may include the same material as the third semiconductor patterns 251. The second epitaxial layer 255 may include a material having a smaller lattice constant than the third semiconductor patterns 251 or may include the same material as the third semiconductor patterns 251. When the third semiconductor patterns 252 are Si, the second epitaxial layer 255 may be Si or a material (for example, SiC) having a smaller lattice constant than Si.

In FIGS. 31 and 32, the first epitaxial layer 155 contacts the first and second semiconductor patterns 151 and 152 located under the first dummy gate electrode 121 and the first gate spacers 140. The second epitaxial layer 255 contacts the third and fourth semiconductor patterns 251 and 252 located under the second dummy gate electrode 221 and the second gate spacers 240.

The following description is based on FIGS. 31 and 32.

Figure 33:
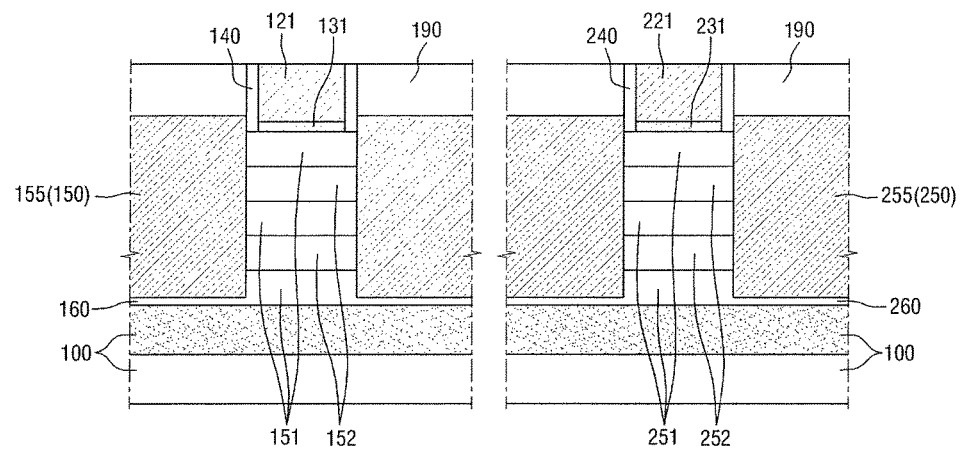
Figure 34:
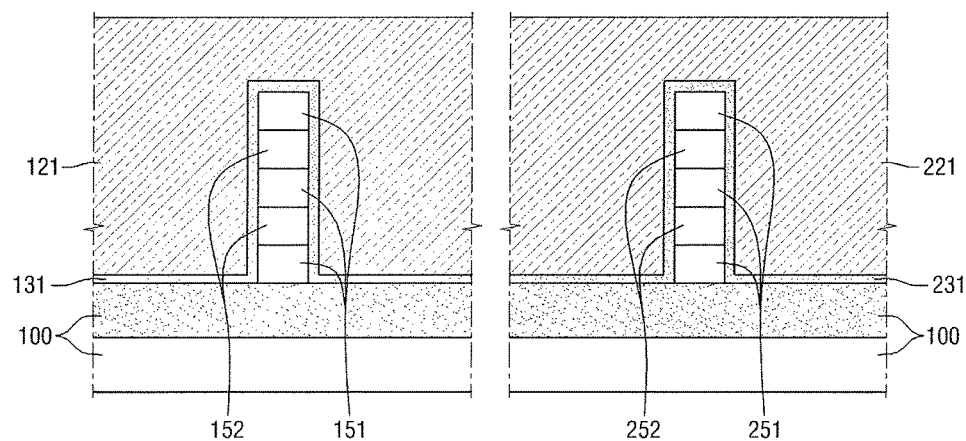

Referring to FIGS. 33 and 34, an interlayer insulating film 190 is formed on the substrate 100 to cover the first source/drain regions 150, the second source/drain regions 250, the first dummy gate electrode 121, the second dummy gate electrode 221, the first gate spacers 140, the second gate spacers 240, etc. Then, the interlayer insulating film 190 is planarized until the first dummy gate electrode 121 and the second dummy gate electrode 221 are exposed. As a result, the third mask pattern 3003 and the fourth mask pattern 3004 may be removed, and an upper surface of the first dummy gate electrode 121 and an upper surface of the second dummy gate electrode 221 may be exposed.

The interlayer insulating film 190 may include at least one of a low-k material, an oxide layer, a nitride layer, and an oxynitride layer. The low-k material may be made of Flowable Oxide (FOX), Tonen SilaZen (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or a combination thereof.

Figure 35:
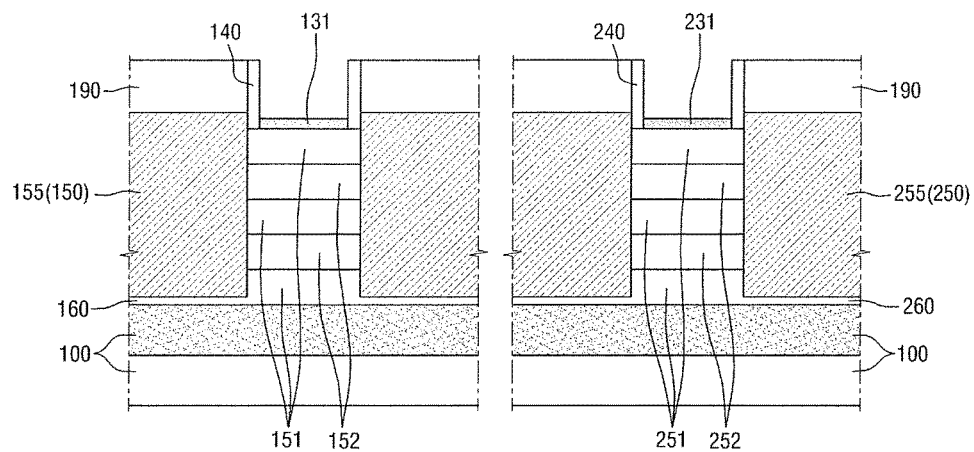
Figure 36:
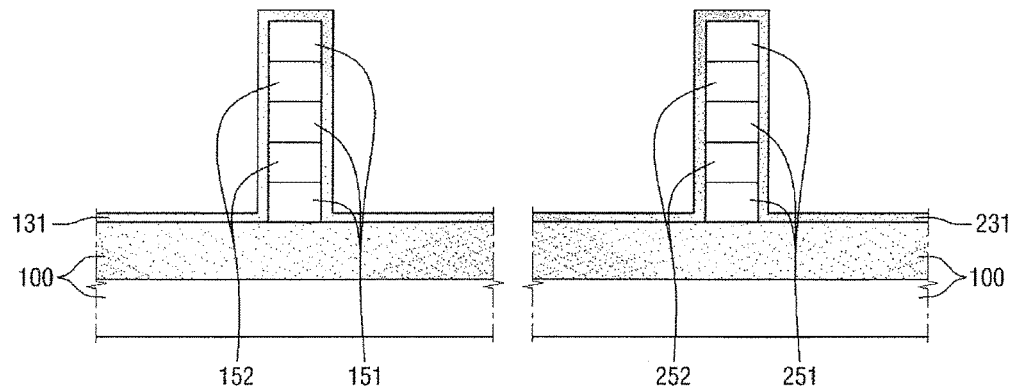

Referring to FIGS. 35 and 36, the first dummy gate electrode 121 having the exposed upper surface and the second dummy gate electrode 221 having the exposed upper surface are removed. The removal of the first dummy gate electrode 121 and the second dummy gate electrode 221 may expose the first capping layer 131 and the second capping layer 231.

Figure 37:
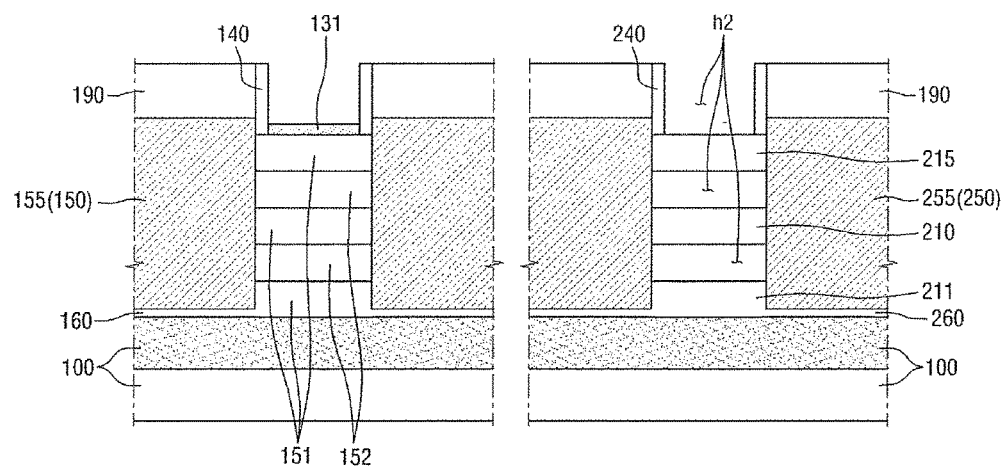
Figure 38:
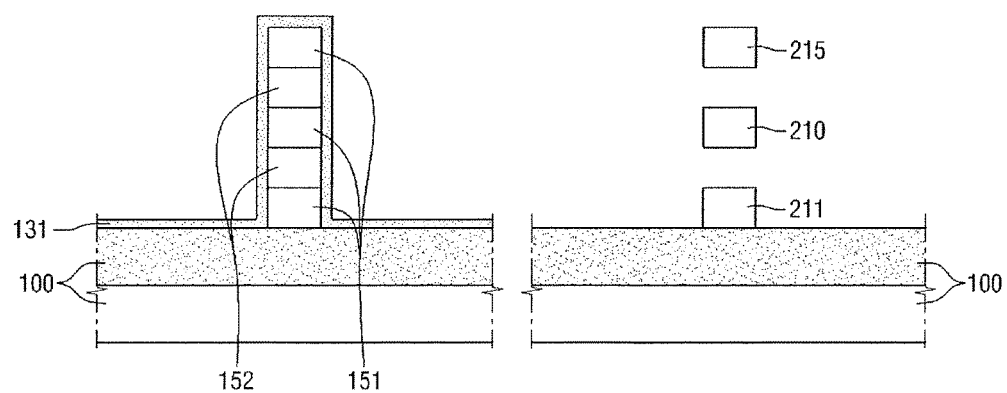

Referring to FIGS. 37 and 38, the fourth semiconductor patterns 252 are removed using a second etchant having a higher etching rate for the fourth semiconductor patterns 252 than for the third semiconductor patterns 251.

In addition, the fourth semiconductor patterns 252 and the second capping layer 231 may be removed together. The fourth semiconductor patterns 252 and the second capping layer 231 may be the same semiconductor material. In this case, the fourth semiconductor patterns 252 and the second capping layer 231 may be removed together by the same etching process. However, the present disclosure is not limited thereto. The fourth semiconductor patterns 252 and the second capping layer 231 may also be removed separately by sequential processes and include different materials.

Therefore, a third wire pattern 210 and a fourth wire pattern 215 made of the third semiconductor patterns 251 are formed in the second area II. Thus, a second wire pattern group (210 and 215) including one or more wire patterns is formed in the second area II. During the formation of the third wire pattern 210 and the fourth wire pattern 215, the third semiconductor pattern 251 which contacts the substrate 100 may not be removed. Accordingly, a dummy wire pattern 211 which contacts the substrate 100 may be formed in the second area II. The second wire pattern group (210 and 215) may extend along the third direction X2. The second wire pattern group (210 and 215) may be formed on an upper substrate 102 to be separated from the upper substrate 102.

In the current embodiment, each of the third wire pattern 210 and the fourth wire pattern 215 has a quadrilateral cross-section. However, the present disclosure is not limited thereto, and corners of each of the third wire pattern 210 and the fourth wire pattern 215 may be rounded by a trimming process.

Since a transistor formed in the second area II may be an N-type transistor, the second wire pattern group (210 and 215) may include a material having high electron mobility. The second wire pattern group (210 and 215) may include one of, but not limited to, Si and a group III-V compound semiconductor.

The removal of the fourth semiconductor patterns 252 may create spaces h2. In addition, the second epitaxial layer 255 may be exposed through the spaces h2.

In the current embodiment, the first area I is exposed as illustrated in the drawings. However, the present disclosure is not limited thereto. In an implementation, a mask layer may be formed to protect the first area I during the formation of the spaces h2.

Figure 39:
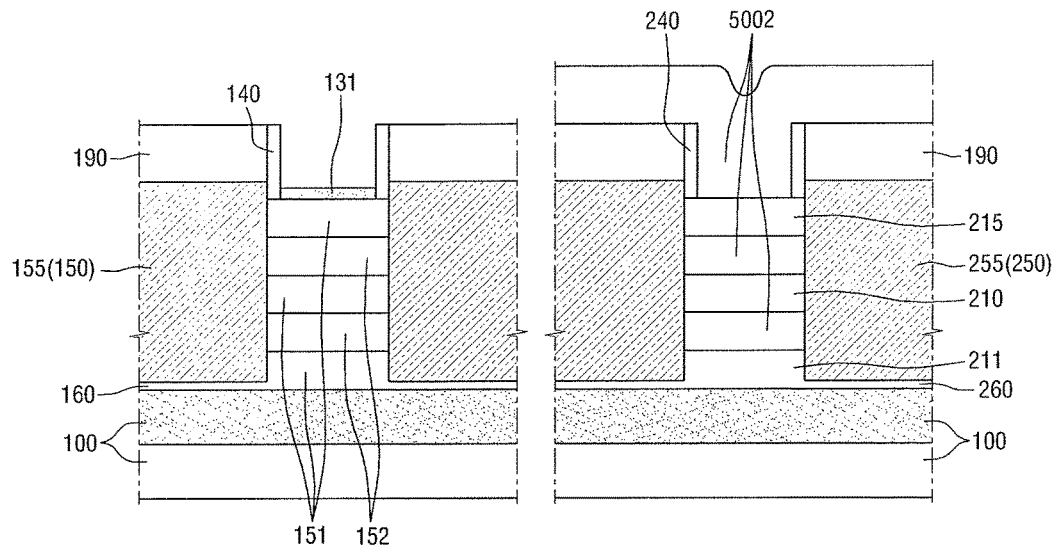
Figure 40:
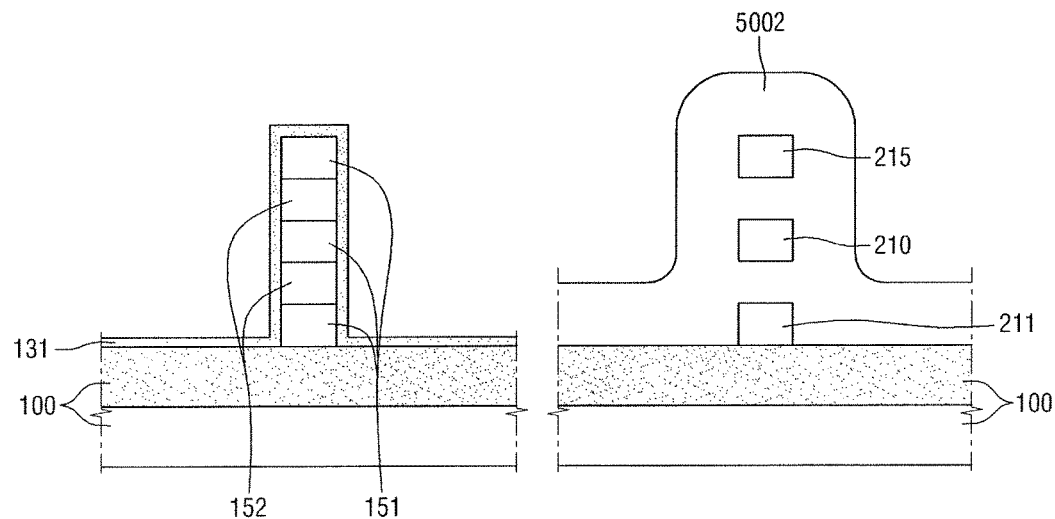

Referring to FIGS. 39 and 40, a second mask layer 5002 is formed in the second area II to cover the second wire pattern group (210 and 215) and the dummy wire pattern 211.

The second mask layer 5002 may include at least one of, but not limited to, silicon oxide, silicon nitride, silicon oxynitride, a metal layer, photoresist, and spin-on-glass (SOG) and/or spin-on-hard mask (SOH). Therefore, the second mask layer 5002 may include a material having an etch selectivity with respect to the first capping layer 131. The second mask layer 5002 may be formed by at least one of, but not limited to, PVD, CVD, ALD, and spin coating.

Figure 41:
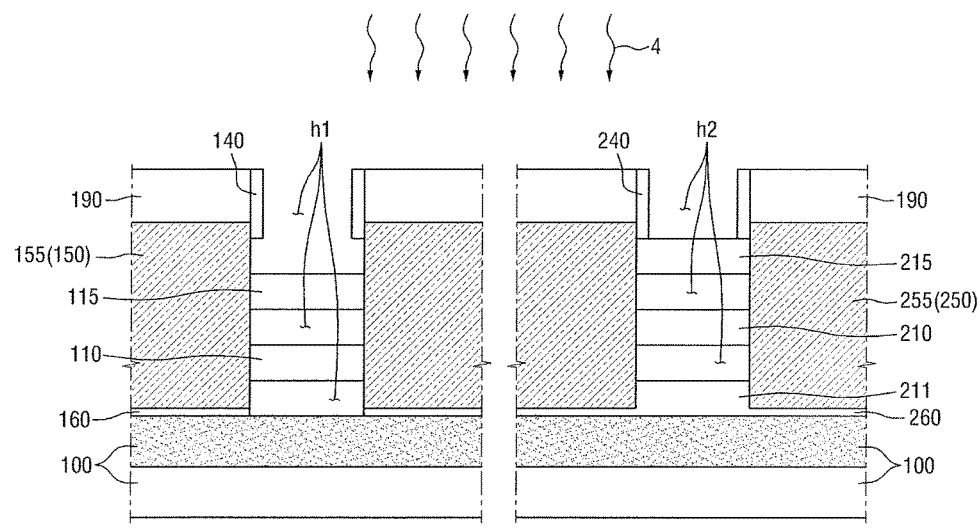
Figure 42:
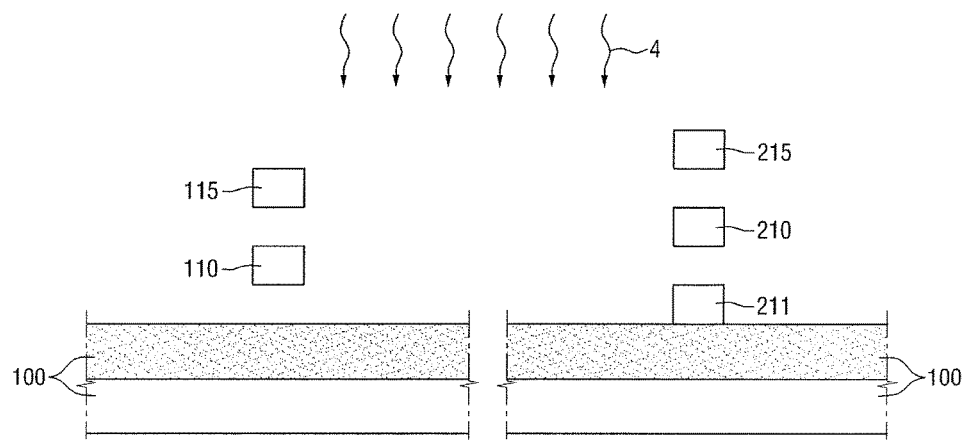

Referring to FIGS. 41 and 42, an etching process is performed using the second mask layer 5002 to sequentially remove the first capping layer 131 and the first semiconductor patterns 151.

Thus, in a state where the second area II is covered with the second mask layer 5002, the first semiconductor patterns 151 are removed using a first etchant having a higher etching rate for the first semiconductor patterns 151 than for the second semiconductor patterns 152.

Accordingly, a first wire pattern 110 and a second wire pattern 115 made of the second semiconductor patterns 152 are formed in the first area I. Thus, a first wire pattern group (110 and 115) including one or more wire patterns is formed in the first area I. The first wire pattern group (110 and 115) extends along the first direction X1. The first wire pattern 110 is formed on the upper substrate 102 to be separated from the upper substrate 102. Thus, the first wire pattern 110 does not contact the substrate 100.

In the current embodiment, each of the first wire pattern 110 and the second wire pattern 115 has a quadrilateral cross-section. However, the present disclosure is not limited thereto, and corners of each of the first wire pattern 110 and the second wire pattern 115 may be rounded by a trimming process.

Since a transistor formed in the first area I may be a P-type transistor, the first wire pattern group (110 and 115) may include a material having high hole mobility. The first wire pattern group (110 and 115) may include one of, but not limited to, SiGe and Ge.

The removal of the first semiconductor patterns 151 may create spaces h1. In addition, the first epitaxial layer 155 may be exposed through the spaces h1.

In the current embodiment, a dummy wire pattern is not formed in the first area I and is formed in the second area II. However, the present disclosure is not limited thereto. Thus, the dummy wire pattern may be formed in the first area I and may not be foil led in the second area II.

Next, a heat-treatment process 4 is performed. The heat-treatment process 4 according to the current embodiment is substantially the same as the heat-treatment process 4 described above with reference to FIGS. 17 and 18.

Thus, the heat-treatment process 4 may reduce the surface roughness of each of the first wire pattern 110, the second wire pattern 115, the third wire pattern 210 and the fourth wire pattern 215 and reduce Ge concentration on the surface of each of the first wire pattern 110, the second wire pattern 115, the third wire pattern 210 and the fourth wire pattern 215.

When the third wire pattern 210 and the fourth wire pattern 215 include Si, the same effect as the effect obtained from the heat-treatment process 4 described above with reference to FIGS. 17 and 18 may be obtained. When the first wire pattern 110 and the second wire pattern 115 include SiGe, Ge atoms on the surface of each of the first wire pattern 110 and the second wire pattern 115 may react with hydrogen plasma to be rearranged and recombined. As a result, the surface roughness of each of the first wire pattern 110 and the second wire pattern 115 may be reduced.

Figure 43:
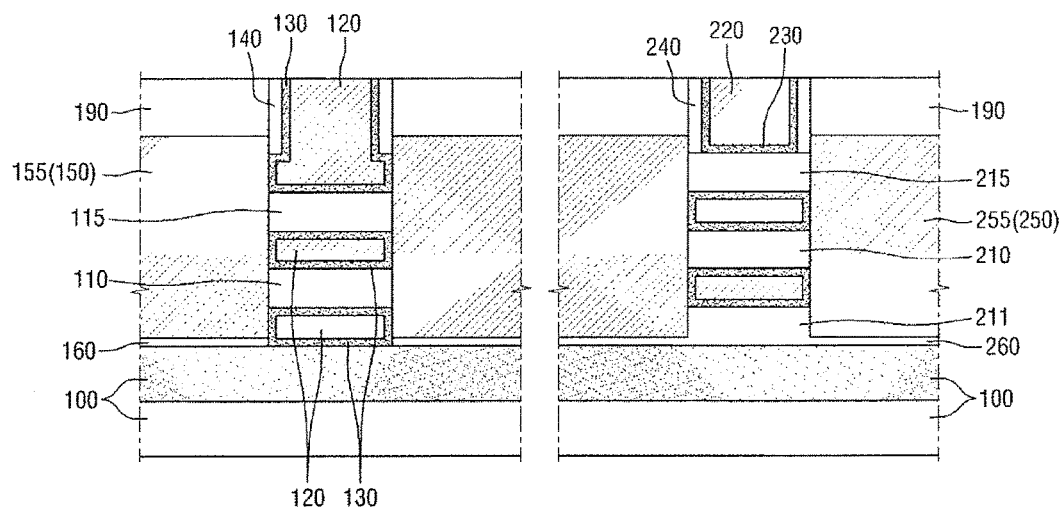
Figure 44:
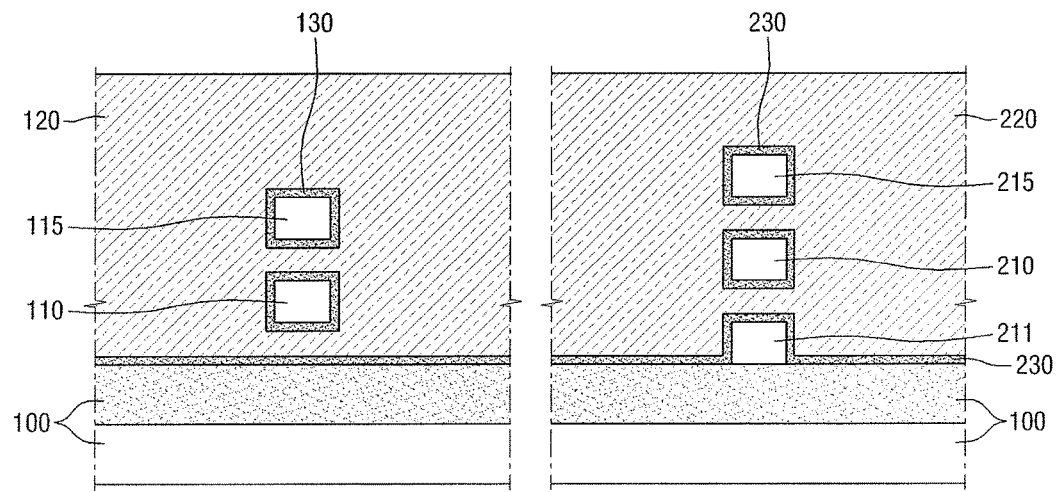

Referring to FIGS. 43 and 44, a first gate insulating layer 130 is formed around the first wire pattern 110 and the second wire pattern 115 and along sidewalls of the first gate spacers 140 and the exposed first epitaxial layer 155. In addition, a second gate insulating layer 230 is formed around the third wire pattern 210 and the fourth wire pattern 215 and along sidewalls of the second gate spacers 240 and the exposed second epitaxial layer 255. Here, the second gate insulating layer 230 is formed along sidewalls and an upper surface of the dummy wire pattern 211. The first gate insulating layer 130 and the second gate insulating layer 230 may be formed conformally.

Accordingly, portions of the first epitaxial layer 155 which are exposed by the removal of the first semiconductor patterns 151 contact the first gate insulating layer 130. In addition, portions of the second epitaxial layer 255 which are exposed by the removal of the fourth semiconductor patterns 252 contact the second gate insulating layer 230.

Each of the first gate insulating layer 130 and the second gate insulating layer 230 may include a high-k material having a higher dielectric constant than a silicon oxide layer. For example, each of the first gate insulating layer 130 and the second gate insulating layer 230 may include one or more of, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Next, a first gate electrode 120 is formed on the first gate insulating layer 130 to surround the first wire pattern 110 and the second wire pattern 115. The first gate electrode 120 extends along the second direction Y1. The first gate electrode 120 may also be formed in a space between the first wire pattern 110 and the substrate 100.

In addition, a second gate electrode 220 is formed on the second gate insulating layer 230 to surround the third wire pattern 210 and the fourth wire pattern 215. The second gate electrode 220 extends along the fourth direction Y2. In addition, since the second gate electrode 220 is formed on the upper surface and sidewalls of the dummy wire pattern 211, it may also be formed between the third wire pattern 210 and the dummy wire pattern 211.

Each of the first gate electrode 120 and the second gate electrode 220 may include a conductive material. In the drawings, each of the first gate electrode 120 and the second gate electrode 220 is a single layer. However, this is merely an example used for ease of description, and the present disclosure is not limited to this example. Thus, each of the first gate electrode 120 and the second gate electrode 220 may include a work function conductive layer which controls a work function and a filling conductive layer which fills a space formed by the work function conductive layer which controls the work function.

Each of the first gate electrode 120 and the second gate electrode 220 may include at least one of, for example, TiN, WN, TaN, Ru, TiC, TaC, Ti, Ag, Al, TiAl, TiAlN, TiAlC, TaCN, TaSiN, Mn, Zr, W, and Al. In other implementations, each of the first gate electrode 120 and the second gate electrode 220 may be made of a material (for example, Si or SiGe) other than a metal. Each of the first gate electrode 120 and the second gate electrode 220 may be formed by, but not limited to, a replacement process.

To form the first gate insulating layer 130, the second gate insulating layer 230, the first gate electrode 120 and the second gate electrode 220, a planarization process may be performed.

Figure 45:
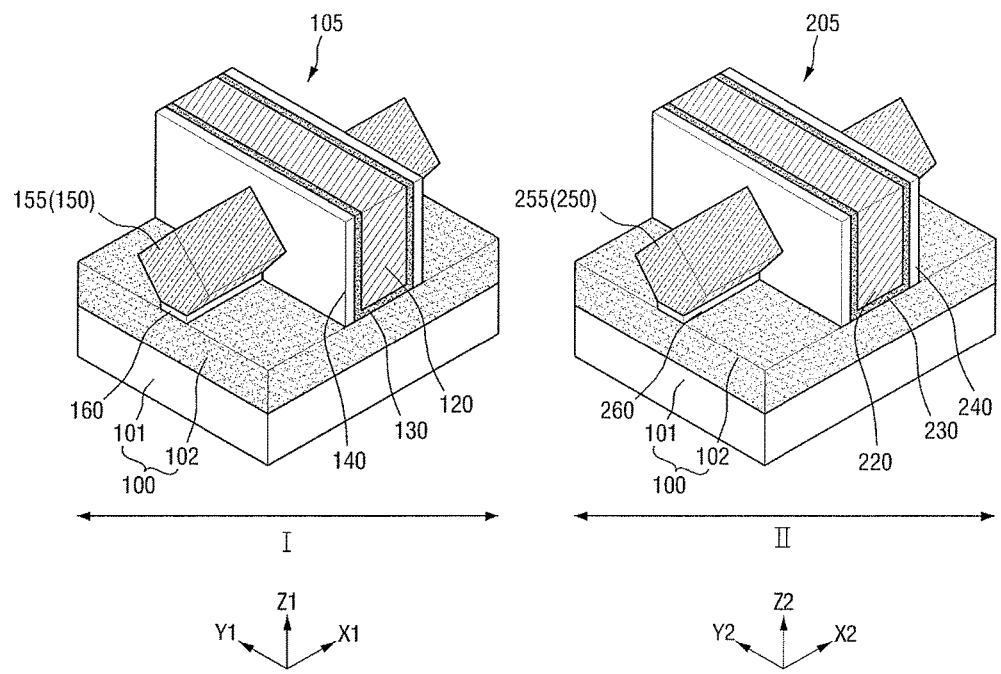

The processes of FIGS. 22 through 44 described above may produce a semiconductor device illustrated in FIG. 45.

Referring to FIG. 45, the semiconductor device fabricated present example embodiment includes a first transistor 105 and a second transistor 205.

As described above, the first transistor 105 may be, but is not limited to, a P-type transistor, and the second transistor 205 may be, but is not limited to, an N-type transistor.

A method of fabricating a semiconductor device according to some example embodiments will now be described with reference to FIGS. 46 through 53. The method of fabricating a semiconductor device according to the current embodiments is substantially the same as the method of fabricating a semiconductor device according to the previous embodiment of FIGS. 22 through 45 except that wire patterns are formed only in one area. Therefore, the current embodiments will hereinafter be described, focusing mainly on differences with the previous embodiment.

Figure 47:
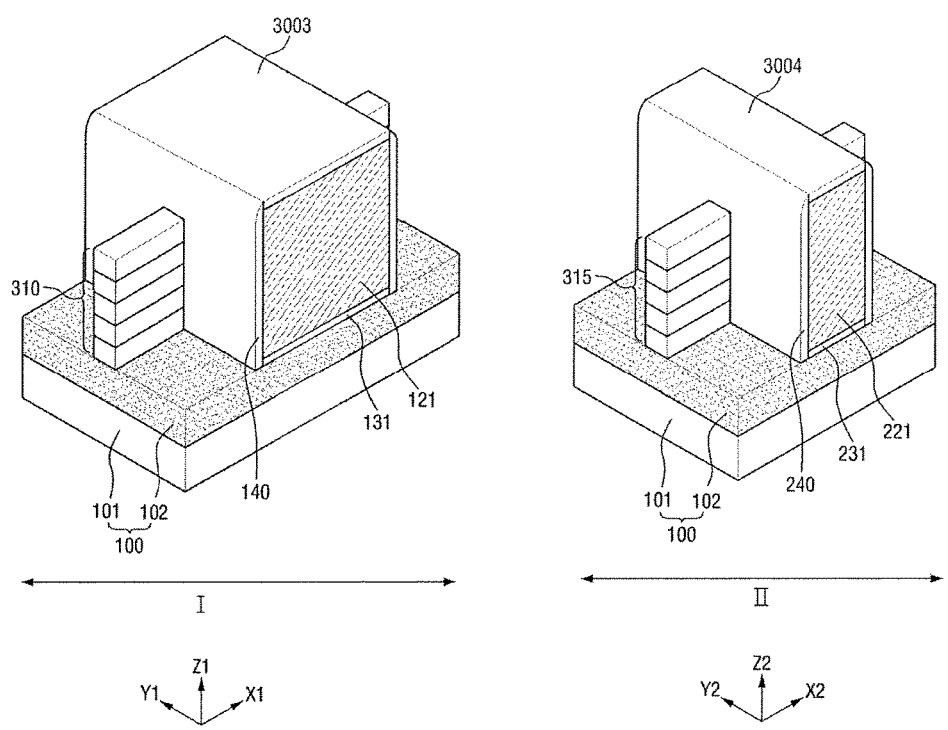
Figure 48:
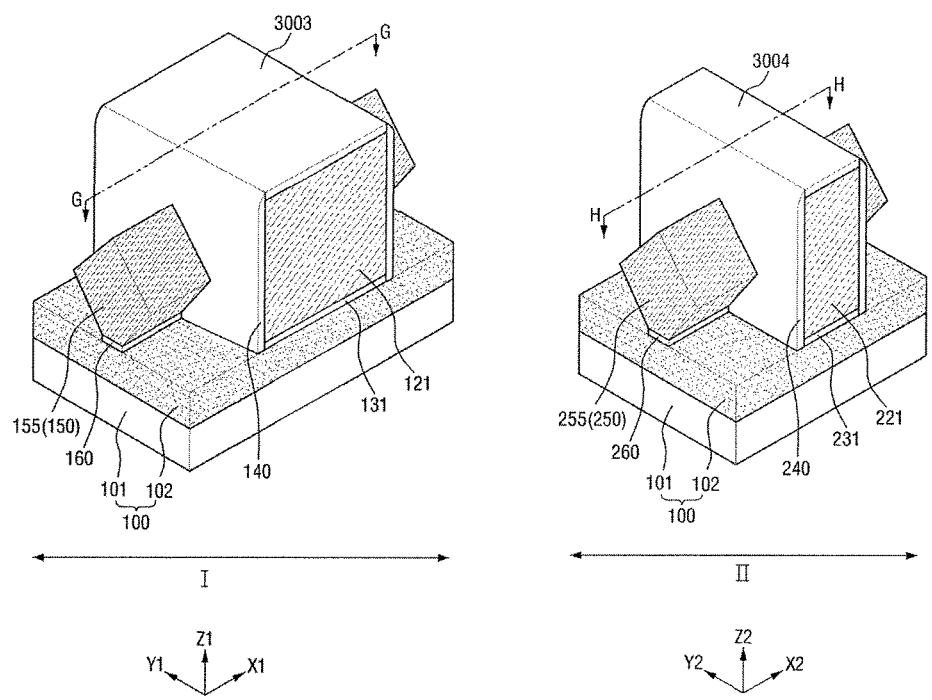
Figure 49:
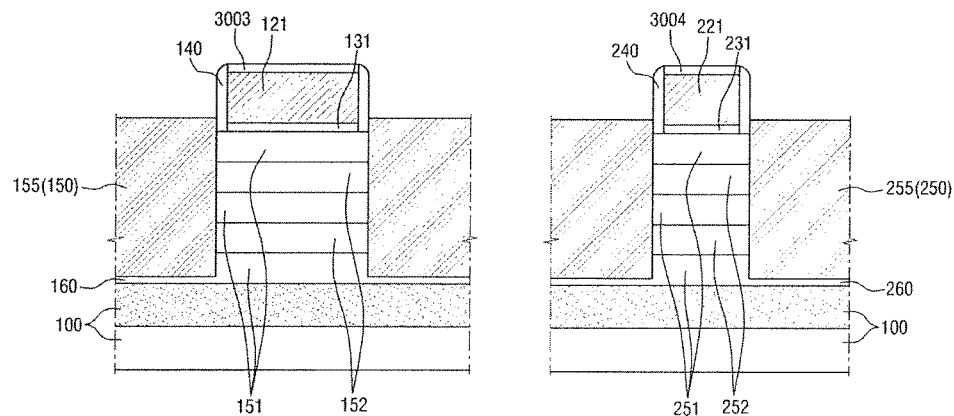

FIGS. 46 through 53 are perspective and cross-sectional views illustrating a method of fabricating a semiconductor device according to some example embodiments. For reference, FIG. 49 shows cross-sectional views taken along the lines G-G and H-H of FIG. 48.

Figure 46:
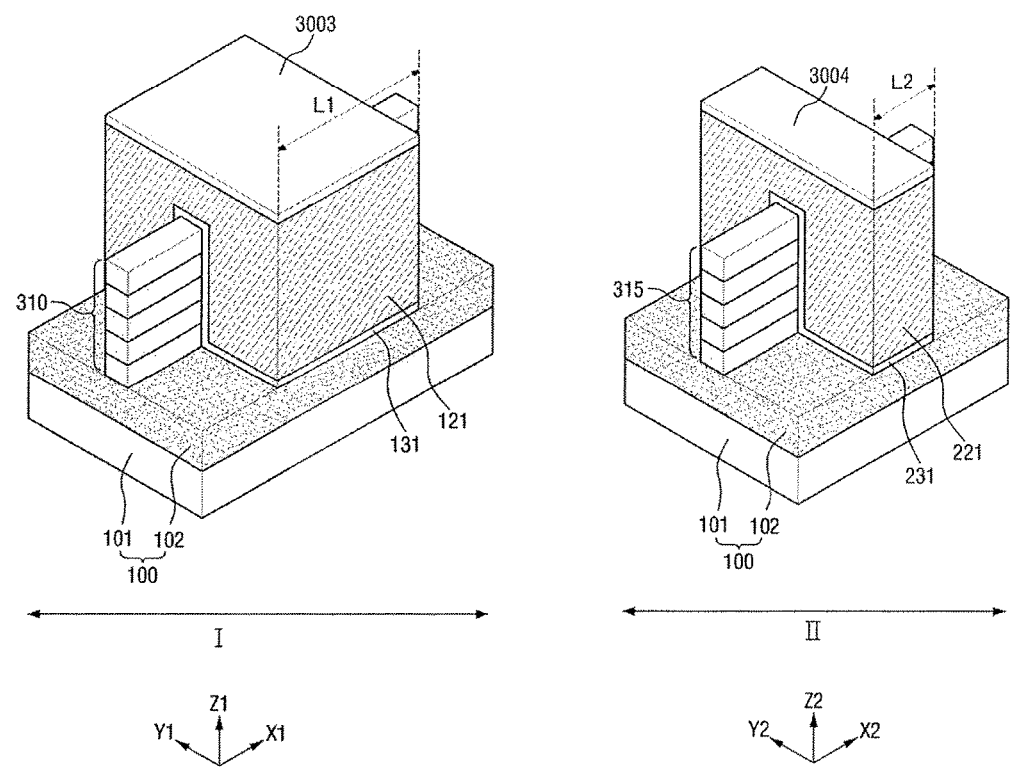
FIGS. 46 through 53 illustrate perspective and cross-sectional views illustrating a method of fabricating a semiconductor device according to some example embodiments.

A step of FIG. 46 may be a next step of the step of FIG. 23 described above, and thus a repetitive description thereof is omitted.

Referring to FIG. 46, an etching process is performed using a third mask pattern 3003, thereby forming a first dummy gate insulting layer 131 and a first dummy gate electrode 121 which extend along a second direction Y1 to intersect a first fin structure 310.

In addition, an etching process is performed using a fourth mask pattern 3004, thereby forming a second dummy gate insulating layer 231 and a second dummy gate electrode 221 which extend along a fourth direction Y2 to intersect a second fin structure 315.

Accordingly, the first dummy gate electrode 121 may be formed on the first fin structure 310, and the second dummy gate electrode 221 may be formed on the second fin structure 315. As illustrated in the drawing, the first dummy gate electrode 121 may have a first width L1 in a first direction X1, and the second dummy gate electrode 221 may have a second width L2 in a third direction X2 smaller than the first width L1.

Each of the first dummy gate insulating layer 131 and the second dummy gate insulating layer 231 may be a silicon oxide layer, and each of the first dummy gate electrode 121 and the second dummy gate electrode 221 may be one of, but not limited to, polysilicon and amorphous silicon.

Referring to FIG. 47, first gate spacers 140 are formed on sidewalls of the first dummy gate electrode 121. In addition, second gate spacers 240 are formed on sidewalls of the second dummy gate electrode 221.

Referring to FIGS. 48 and 49, after the first fin structure 310 exposed on both sides of the first dummy gate electrode 121 and the first gate spacers 140 is removed, a first epitaxial layer 155 is formed. Thus, first source/drain regions 150 are formed on both sides of the first dummy gate electrode 121. The first epitaxial layer 155 may be formed by epitaxial growth after the removal of the exposed first fin structure 310.

After the second fin structure 315 exposed on both sides of the second dummy gate electrode 221 and the second gate spacers 240 is removed, a second epitaxial layer 255 is formed. Thus, second source/drain regions 250 are formed on both sides of the second dummy gate electrode 221.

The following description is based on FIG. 49.

Figure 50:
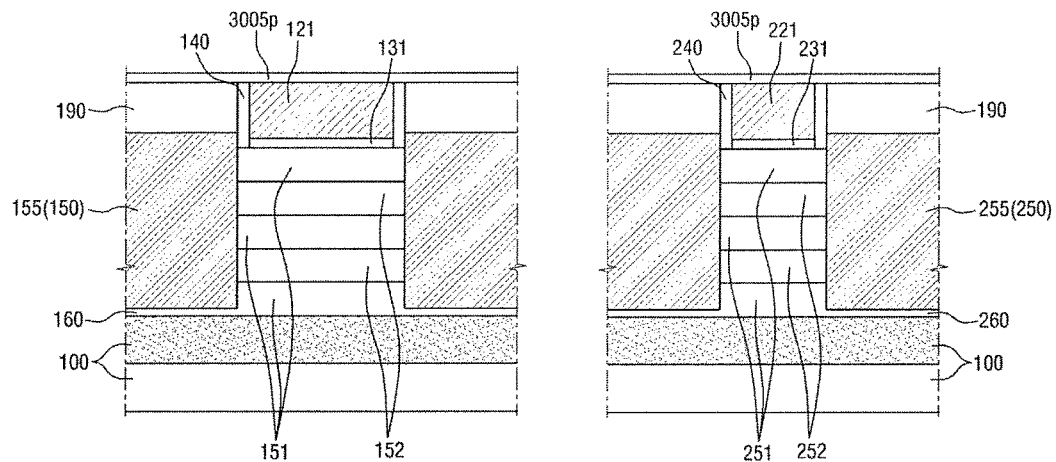

Referring to FIG. 50, an interlayer insulating film 190 is formed on a substrate 100 to cover the first source/drain regions 150, the second source/drain regions 250, the first dummy gate electrode 121, the second dummy gate electrode 221, the first gate spacers 140, the second gate spacers 240, etc.

Then, a mask layer 3005p is formed on the interlayer insulating film 190 to cover the first area I and the second area II. Therefore, an upper surface of the first dummy gate electrode 121 and an upper surface of the second dummy gate electrode 221 are covered by the mask layer 3005p. The mask layer 3005p may include at least one of, for example, an oxide layer, a nitride layer, and an oxynitride layer.

Figure 51:
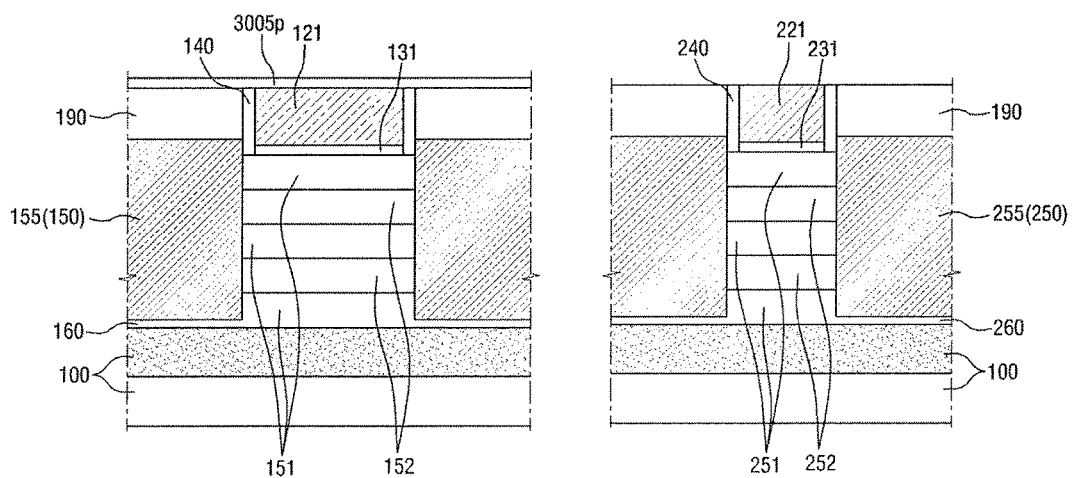

Referring to FIG. 51, the mask layer 3005p formed in the second area II is removed. As a result, the mask layer 3005p remains only in the first area I.

The removal of the mask layer 3005p in the second area II exposes the upper surface of the second dummy gate electrode 221. In addition, the mask layer 3005p remaining in the first area I covers the first dummy gate electrode 121 and the first gate spacers 140.

Figure 52:
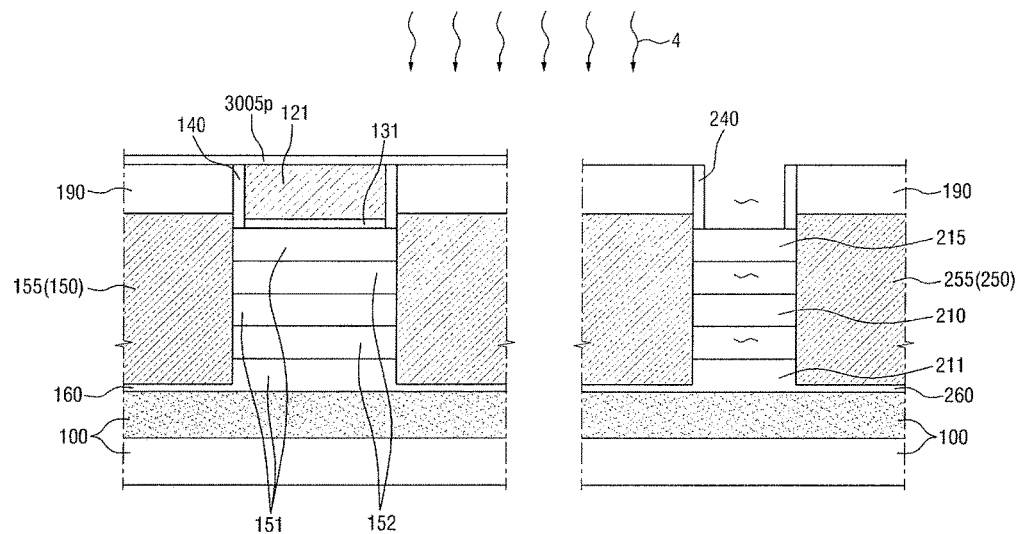

Referring to FIG. 52, the exposed second dummy gate electrode 221 and the second dummy gate insulating layer 231 in the second area II may be removed sequentially using the mask layer 3005p as a mask.

Then, fourth semiconductor patterns 252 are removed using a first etchant having a higher etching rate for the fourth semiconductor patterns 252 than for third semiconductor patterns 251.

Accordingly, a third wire pattern 210 and a fourth wire pattern 215 made of the third semiconductor patterns 352 are formed in the second area II. Thus, a second wire pattern group (210 and 215) including one or more wire patterns is formed in the second area II.

Next, the heat-treatment process 4 may be performed. The heat-treatment process 4 may reduce the roughness and Ge concentration of a surface of each of the third wire pattern 210 and the fourth wire pattern 215. In addition, the heat-treatment process 4 may reduce the roughness of an exposed surface of each of first and second semiconductor patterns 151 and 152.

Figure 53:
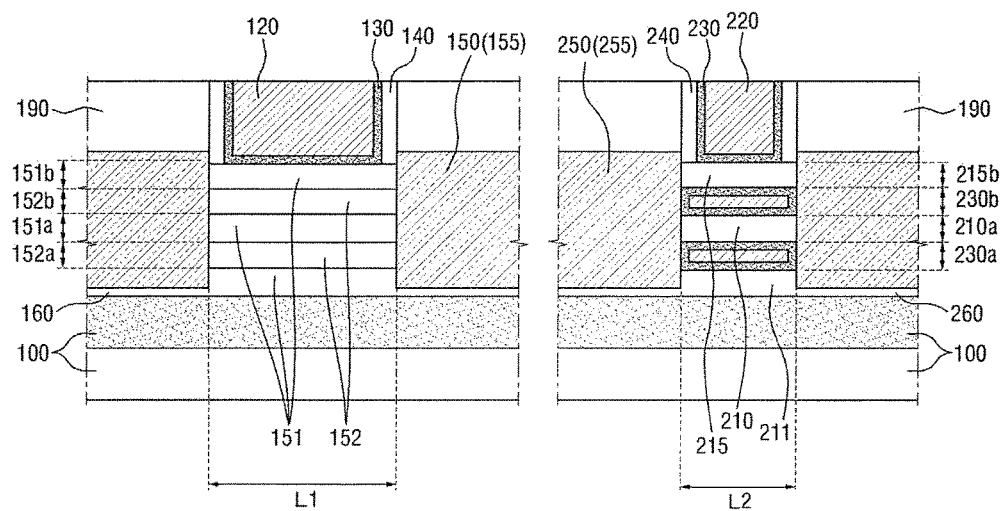

Referring to FIG. 53, a second gate insulating layer 230 is formed around the first wire pattern 210 and the third wire pattern 215 and along sidewalls of the second gate spacers 240 and the exposed second epitaxial layer 255.

Then, a second gate electrode 220 is formed on the second gate insulating layer 230 to surround the third wire pattern 210 and the fourth wire pattern 215.

To form the second gate insulating layer 230 and the second gate electrode 220, a planarization process may be performed. The planarization process may remove the mask layer 3005p formed in the first area I.

Referring to FIG. 53, a first gate insulating layer 130 is formed in the first area I along an upper surface and sidewalls of a fin (151 and 152) and along sidewalls of the first gate spacers 140. Then, a first gate electrode 220 is formed on the first gate insulating layer 130 to cover the upper surface and sidewalls of the fin (151 and 152).

Figure 54:
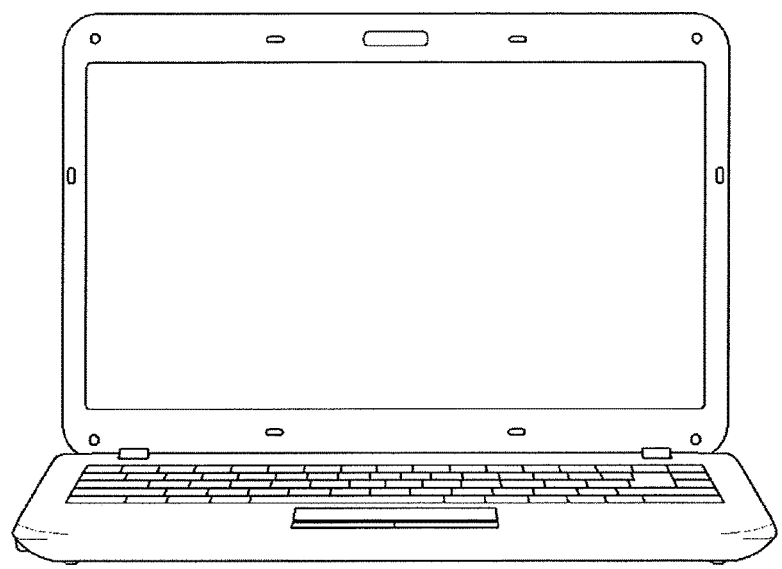
FIG. 54 illustrates an example semiconductor system to which a semiconductor device fabricated according to some example embodiments may be applied.

FIG. 54 illustrates an example semiconductor system to which a semiconductor device fabricated according to embodiments may be applied. FIG. 54 illustrates a notebook computer. A semiconductor device fabricated according to embodiments, as set forth herein, may be used in a tablet personal computer (PC), a notebook computer, smartphone, etc. The semiconductor device fabricated according to the embodiments, as set forth herein, may also be applied to various integrated circuit (IC) devices other than those set forth herein.

By way of summation and review, a multi-gate transistor may be obtained by forming a fin- or nanowire-shaped silicon body on a substrate and forming a gate on a surface of the silicon body. The multi-gate transistor may be easily scaled because it uses a three-dimensional (3D) channel. In addition, the current control capability of the multi-gate transistor may be improved without the need to increase the gate length of the multi-gate transistor. Moreover, it may be possible to effectively suppress a short channel effect (SCE) in which an electric potential of a channel region is affected by a drain voltage.

Meanwhile, attempts to introduce a new semiconductor material are being made to improve mobility in a channel region included in a transistor.

As described above, some embodiments relate to a method of fabricating a semiconductor device having a gate-all-around structure. Embodiments may provide a method of fabricating a semiconductor device with improved reliability. Embodiments may also provide a method of fabricating a semiconductor device which has improved driving current characteristics in a channel region. Embodiments may also provide a method of fabricating a semiconductor device which includes a gate dielectric layer with improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
forming a first fin structure which includes first semiconductor patterns and second semiconductor patterns stacked alternately on a substrate and extends in a first direction;
forming an exposed first wire pattern group which includes the second semiconductor patterns by removing the first semiconductor patterns;
heat-treating the exposed first wire pattern group using hydrogen plasma; and
forming a first gate electrode which surrounds the first wire pattern group and extends in a second direction different from the first direction.

2. The method as claimed in claim 1, wherein the heat-treating of the exposed first wire pattern group is performed at a temperature of 650° C. or below.

3. The method as claimed in claim 1, wherein the first semiconductor patterns include SiGe, and the second semiconductor patterns include Si.

4. The method as claimed in claim 1, wherein the heat-treating of the exposed first wire pattern group includes vaporizing part of the first semiconductor patterns remaining on a surface of the first wire pattern group.

5. The method as claimed in claim 1, further comprising:
forming a second fin structure, which includes third semiconductor patterns and fourth semiconductor patterns stacked alternately and extends in a third direction, on the substrate to be separated from the first fin structure; and
forming a second gate electrode on the second fin structure to extend in a fourth direction different from the third direction.

6. The method as claimed in claim 5, wherein the forming of the second fin structure is performed before the heat-treating of the exposed first wire pattern group.

7. The method as claimed in claim 5, wherein a first width by which the first wire pattern group and the first gate electrode overlap each other is smaller than a second width by which the second fin structure and the second gate electrode overlap each other.

8. The method as claimed in claim 1, further comprising:
forming a second fin structure, which includes third semiconductor patterns and fourth semiconductor patterns stacked alternately and extends in a third direction, on the substrate to be separated from the first fin structure;
forming an exposed second wire pattern group which includes the third semiconductor patterns by removing the fourth semiconductor patterns; and
forming a second gate electrode which surrounds the second wire pattern group and extends in a fourth direction different from the third direction,
wherein the second semiconductor patterns and the third semiconductor patterns include different semiconductor materials each other.

9. The method as claimed in claim 8, wherein the heat-treating of the exposed first wire pattern group includes heat-treating the exposed second wire pattern group.

10. A method of fabricating a semiconductor device, the method comprising:
forming a first fin structure which includes first semiconductor patterns and second semiconductor patterns stacked alternately on a substrate and extends in a first direction;
forming an exposed first wire pattern group which includes the second semiconductor patterns by partially removing the first semiconductor patterns;
vaporizing the first semiconductor patterns remaining on the exposed first wire pattern group, the vaporizing of the first semiconductor patterns including performing heat treatment using hydrogen plasma; and
forming a first gate electrode which surrounds the first wire pattern group and extends in a second direction different from the first direction.

11. The method as claimed in claim 10, wherein the heat treatment is performed at a temperature of 650° C. or below.

12. The method as claimed in claim 10, wherein the first semiconductor patterns include SiGe, and the second semiconductor patterns include Si.

13. The method as claimed in claim 10, wherein the vaporizing of the first semiconductor patterns includes combining an element and hydrogen contained in each of the first semiconductor patterns and vaporizing the combined element and hydrogen.

14. A method of fabricating a semiconductor device, the method comprising:
forming a stack of alternating first and second semiconductor layers on a substrate, the first and second semiconductor layers alternating in a first direction that extends away from the substrate;
removing portions of the stack to expose each of the first and second semiconductor layers in the stack so as to form alternating first and second semiconductor patterns;
subsequently, removing the second semiconductor patterns from between the first semiconductor patterns such that the first semiconductor patterns remain; and
subsequently, treating the remaining first semiconductor patterns using a hydrogen plasma.

15. The method as claimed in claim 14, wherein the first semiconductor layers are formed using a germanium-free material and the second semiconductor layers are formed using a germanium-containing material.

16. The method as claimed in claim 14, further comprising forming a gate insulating layer on the first semiconductor patterns after treating the first semiconductor patterns using the hydrogen plasma, and forming a gate material on the gate insulating layer.

17. The method as claimed in claim 16, where a surface of the first semiconductor patterns at an interface of the first semiconductor patterns and the gate insulating material is substantially free of germanium.

18. The method as claimed in claim 16, wherein the first semiconductor patterns form at least two channel regions in a stack in a gate-all-around finFET transistor.

* * * * *